United States Patent
Shin et al.

(10) Patent No.: US 7,190,071 B2
(45) Date of Patent: Mar. 13, 2007

(54) SEMICONDUCTOR PACKAGE AND METHOD FOR FABRICATING THE SAME

(75) Inventors: Won Sun Shin, KyungKi-Do (KR); Seon Goo Lee, Seoul (KR); Do Sung Chun, Chacheongsao (KR); Tae Hoan Jang, Seoul (KR); Vincent DiCaprio, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 120 days.

(21) Appl. No.: 10/785,528

(22) Filed: Feb. 24, 2004

(65) Prior Publication Data

US 2004/0164411 A1 Aug. 26, 2004

Related U.S. Application Data

(63) Continuation of application No. 10/306,627, filed on Nov. 26, 2002, now Pat. No. 6,717,248, which is a continuation of application No. 09/566,069, filed on May 5, 2000, now Pat. No. 6,515,356.

(30) Foreign Application Priority Data

| May 7, 1999 | (KR) | ................................ | 1999-16319 |
| Jun. 7, 1999 | (KR) | ................................ | 1999-20939 |
| Sep. 7, 1999 | (KR) | ................................ | 1999-37925 |
| Sep. 7, 1999 | (KR) | ................................ | 1999-37928 |

(51) Int. Cl.
H01L 23/48 (2006.01)
H01L 23/52 (2006.01)
H01L 29/40 (2006.01)
H01L 23/02 (2006.01)

(52) U.S. Cl. ...................... 257/734; 257/686; 257/780; 257/777

(58) Field of Classification Search ................ 257/777, 257/734, 790, 778, 780
See application file for complete search history.

(56) References Cited

U.S. PATENT DOCUMENTS 3,851,221 A 11/1974 Beaulieu et al.

(Continued)

FOREIGN PATENT DOCUMENTS

JP 61117858 5/1986

(Continued)

*Primary Examiner*—Chuong Anh Luu
(74) *Attorney, Agent, or Firm*—Gunnison, McKay & Hodgson, L.L.P.; Serge J. Hodgson

(57) ABSTRACT

There is provided a semiconductor package and method for fabricating the same. An embodiment of the semiconductor package includes: a semiconductor chip having a first face and a second face, the first face having a plurality of input/output pads formed thereon; a circuit board composed of a resin film having a first face and a second face, a circuit pattern layer including a plurality of bond fingers and ball lands, and a cover coat covering the circuit pattern layer and selectively exposing the plurality of bond fingers and ball lands, the circuit pattern layer being formed on the first face of the resin film, the circuit board having a through hole at the center thereof, the semiconductor chip being placed in the through hole; electrical connection means for electrically connecting the input/output pads of the semiconductor chip to the bond fingers of the circuit board; an encapsulant for encapsulating the semiconductor chip, connection means and a part of the circuit board; and a plurality of conductive balls fused to the circuit board. Accordingly, the semiconductor package becomes very thin and its heat spreading performance is improved.

9 Claims, 31 Drawing Sheets

U.S. PATENT DOCUMENTS

| | | | |
|---|---|---|---|
| 4,398,235 A | 8/1983 | Lutz et al. | |
| 4,530,152 A | 7/1985 | Roche et al. | |
| 4,567,643 A | 2/1986 | Droguet et al. | |
| 4,707,724 A | 11/1987 | Suzuki et al. | |
| 4,729,061 A | 3/1988 | Brown | |
| 4,730,232 A | 3/1988 | Lindberg | |
| 4,756,080 A | 7/1988 | Thorp, Jr. et al. | |
| 4,763,188 A | 8/1988 | Johnson | |
| 4,982,265 A | 1/1991 | Watanabe et al. | |
| 4,996,587 A | 2/1991 | Hinrichsmeyer et al. | |
| 5,001,302 A | 3/1991 | Atsumi | |
| 5,012,323 A | 4/1991 | Farnworth | |
| 5,025,306 A | 6/1991 | Johnson et al. | |
| 5,040,052 A | 8/1991 | McDavid | |
| 5,138,438 A | 8/1992 | Masayuki et al. | |
| 5,140,404 A | 8/1992 | Fogal et al. | |
| 5,157,480 A | 10/1992 | McShane et al. | |
| 5,165,067 A | 11/1992 | Wakefield et al. | |
| 5,198,888 A | 3/1993 | Sugano et al. | |
| 5,200,362 A | 4/1993 | Lin et al. | |
| 5,229,647 A | 7/1993 | Gnadinger | |
| 5,241,133 A | 8/1993 | Mullen, III et al. | |
| 5,273,938 A | 12/1993 | Lin et al. | |
| 5,291,061 A | 3/1994 | Ball | |
| 5,323,060 A | 6/1994 | Fogal et al. | |
| 5,334,875 A | 8/1994 | Sugano et al. | |
| 5,347,429 A | 9/1994 | Kohno et al. | |
| 5,394,010 A | 2/1995 | Tazawa et al. | |
| 5,422,435 A | 6/1995 | Takiar et al. | |
| 5,426,563 A | 6/1995 | Moresco et al. | |
| 5,432,729 A | 7/1995 | Carson et al. | |
| 5,438,224 A | 8/1995 | Papageorge et al. | |
| 5,450,283 A | 9/1995 | Lin et al. | |
| 5,463,253 A | 10/1995 | Waki et al. | |
| 5,473,196 A | 12/1995 | De Givry | |
| 5,474,957 A | 12/1995 | Urushima | |
| 5,474,958 A | 12/1995 | Djennas et al. | |
| 5,491,612 A | 2/1996 | Nicewarner, Jr. | |
| 5,495,394 A | 2/1996 | Kornfeld et al. | |
| 5,495,398 A | 2/1996 | Takiar et al. | |
| 5,502,289 A | 3/1996 | Takiar et al. | |
| 5,514,907 A | 5/1996 | Moshayedi | |
| 5,545,922 A | 8/1996 | Golwalkar et al. | |
| 5,569,625 A | 10/1996 | Yoneda et al. | |
| 5,581,498 A | 12/1996 | Ludwig et al. | |
| 5,583,378 A | 12/1996 | Marrs et al. | |
| 5,587,341 A | 12/1996 | Masayuki et al. | |
| 5,594,275 A | 1/1997 | Kwon et al. | |
| 5,604,376 A | 2/1997 | Hamburgen et al. | |
| 5,614,766 A | 3/1997 | Takasu et al. | |
| 5,620,928 A | 4/1997 | Lee et al. | |
| 5,625,221 A | 4/1997 | Kim et al. | |
| 5,637,536 A | 6/1997 | Val | |
| 5,637,912 A | 6/1997 | Cockerill et al. | |
| 5,640,047 A | 6/1997 | Nakashima | |
| 5,646,828 A | 7/1997 | Degani et al. | |
| 5,650,593 A | 7/1997 | McMillan et al. | |
| 5,652,185 A | 7/1997 | Lee | |
| 5,668,405 A | 9/1997 | Yamashita | |
| 5,677,569 A | 10/1997 | Choi et al. | |
| 5,682,062 A | 10/1997 | Gaul | |
| 5,689,135 A | 11/1997 | Ball | |
| 5,696,031 A | 12/1997 | Wark | |
| 5,696,666 A * | 12/1997 | Miles et al. | 361/764 |
| 5,715,147 A | 2/1998 | Nagano | |
| 5,721,452 A | 2/1998 | Fogal et al. | |
| 5,729,051 A | 3/1998 | Nakamura | |
| 5,739,581 A | 4/1998 | Chillara et al. | |
| 5,744,827 A | 4/1998 | Jeong et al. | |
| 5,760,471 A | 6/1998 | Fujisawa et al. | |
| 5,763,939 A | 6/1998 | Yamashita | |
| 5,767,528 A | 6/1998 | Sumi et al. | |
| 5,776,798 A | 7/1998 | Quan et al. | |
| 5,777,387 A | 7/1998 | Yamashita et al. | |
| 5,783,870 A | 7/1998 | Mostafazadeh et al. | |
| 5,786,239 A | 7/1998 | Ohsawa et al. | |
| 5,793,108 A | 8/1998 | Nakanishi et al. | |
| 5,796,586 A | 8/1998 | Lee et al. | |
| 5,798,014 A | 8/1998 | Weber | |
| 5,801,439 A | 9/1998 | Fujisawa et al. | |
| 5,815,372 A | 9/1998 | Gallas | |
| 5,819,398 A | 10/1998 | Wakefield | |
| 5,835,355 A | 11/1998 | Dordi | |
| 5,835,988 A | 11/1998 | Ishii | |
| 5,854,741 A | 12/1998 | Shim et al. | |
| 5,859,471 A | 1/1999 | Kuraishi et al. | |
| 5,861,666 A | 1/1999 | Bellaar | |
| 5,866,949 A | 2/1999 | Schueller | |
| 5,872,025 A | 2/1999 | Cronin et al. | |
| 5,883,426 A | 3/1999 | Tokuno et al. | |
| 5,885,849 A | 3/1999 | DiStefano et al. | |
| 5,886,412 A | 3/1999 | Fogal et al. | |
| 5,894,108 A | 4/1999 | Mostafazadeh et al. | |
| 5,903,052 A | 5/1999 | Chen et al. | |
| 5,909,633 A | 6/1999 | Haji et al. | |
| 5,917,242 A | 6/1999 | Ball | |
| 5,930,599 A | 7/1999 | Fujimoto et al. | |
| 5,952,611 A | 9/1999 | Eng et al. | |
| 5,973,403 A | 10/1999 | Wark | |
| 5,977,640 A | 11/1999 | Bertin et al. | |
| 5,986,209 A | 11/1999 | Tandy | |
| 5,986,317 A | 11/1999 | Wiese | |
| 6,001,671 A | 12/1999 | Fjelstad | |
| 6,005,778 A | 12/1999 | Spielberger et al. | |
| 6,013,948 A | 1/2000 | Akram et al. | |
| RE36,613 E | 3/2000 | Ball | |
| 6,034,423 A | 3/2000 | Mostafazadeh et al. | |
| 6,034,427 A | 3/2000 | Lan et al. | |
| 6,051,886 A | 4/2000 | Fogal et al. | |
| 6,057,598 A | 5/2000 | Payne et al. | |
| 6,060,778 A | 5/2000 | Jeong et al. | |
| 6,072,233 A | 6/2000 | Corisis et al. | |
| 6,072,243 A | 6/2000 | Nakanishi | |
| 6,074,898 A | 6/2000 | Ohsawa et al. | |
| 6,080,264 A | 6/2000 | Ball | |
| 6,081,037 A | 6/2000 | Lee et al. | |
| 6,093,970 A | 7/2000 | Ohsawa et al. | |
| 6,099,677 A | 8/2000 | Logothetis et al. | |
| 6,100,804 A | 8/2000 | Brady et al. | |
| 6,107,689 A | 8/2000 | Kozono | |
| 6,118,184 A | 9/2000 | Ishio et al. | |
| 6,122,171 A | 9/2000 | Akram et al. | |
| 6,126,428 A | 10/2000 | Mitchell et al. | |
| 6,127,833 A | 10/2000 | Wu et al. | |
| 6,133,637 A | 10/2000 | Hikita et al. | |
| 6,160,705 A | 12/2000 | Stearns et al. | |
| 6,172,419 B1 * | 1/2001 | Kinsman | 257/737 |
| 6,180,696 B1 | 1/2001 | Wong et al. | |
| 6,180,881 B1 | 1/2001 | Isaak | |
| 6,184,463 B1 | 2/2001 | Panchou et al. | |
| 6,198,171 B1 | 3/2001 | Huang et al. | |
| 6,214,641 B1 | 4/2001 | Akram | |
| 6,228,676 B1 | 5/2001 | Glenn et al. | |
| 6,235,554 B1 | 5/2001 | Akram et al. | |
| 6,242,279 B1 | 6/2001 | Ho et al. | |
| 6,257,857 B1 | 7/2001 | Lee et al. | |
| 6,258,632 B1 | 7/2001 | Takebe | |
| 6,261,869 B1 | 7/2001 | Radford et al. | |
| 6,262,490 B1 | 7/2001 | Hsu et al. | |
| 6,268,568 B1 | 7/2001 | Kim | |
| 6,271,057 B1 | 8/2001 | Lee et al. | |
| 6,274,404 B1 | 8/2001 | Hirasawa et al. | |
| 6,277,672 B1 | 8/2001 | Ho | |
| 6,303,998 B1 | 10/2001 | Murayama | |

| | | | | | |
|---|---|---|---|---|---|
| 6,313,522 B1 * | 11/2001 | Akram et al. ............... 257/686 | JP | 62126661 | 6/1987 |
| 6,326,696 B1 | 12/2001 | Horton et al. | JP | 64001269 | 1/1989 |
| 6,329,709 B1 | 12/2001 | Moden et al. | JP | 1071162 | 3/1989 |
| 6,395,578 B1 | 5/2002 | Shin et al. | JP | 4056262 | 2/1992 |
| 6,399,418 B1 | 6/2002 | Glenn et al. | JP | 6-120364 | 4/1994 |
| 6,404,046 B1 | 6/2002 | Glenn et al. | JP | 6-151645 | 5/1994 |
| 6,448,506 B1 | 9/2002 | Glenn et al. | JP | 6-163751 | 6/1994 |
| 6,452,278 B1 | 9/2002 | DiCaprio et al. | KR | 1996-0009776 | 4/1996 |
| 6,459,148 B1 | 10/2002 | Chun-Jen et al. | KR | 1997-0019144 | 5/1997 |
| 6,486,537 B1 | 11/2002 | Liebhard | KR | 1999-0065599 | 8/1999 |
| 6,501,184 B1 | 12/2002 | Shin et al. | KR | 1999-0080278 | 11/1999 |
| 6,515,356 B1 | 2/2003 | Shin et al. | | | |
| 6,564,454 B1 | 5/2003 | Glenn et al. | | | |
| 6,577,013 B1 | 6/2003 | Glenn et al. | | | |

FOREIGN PATENT DOCUMENTS

| | | | |
|---|---|---|---|
| JP | 62119952 | 6/1987 | * cited by examiner | ural form. Bond fingers
SEMICONDUCTOR PACKAGE AND METHOD FOR FABRICATING THE SAME

CROSS-REFERENCE TO RELATED APPLICATIONS

This application is a continuation of U.S. patent application Ser. No. 10/306,627, filed Nov. 26, 2002 U.S. Pat. No. 6,717,248, which was a continuation of U.S. patent application Ser. No. 09/566,069, filed May 5, 2000, now U.S. Pat. No. 6,515,356, issued on Feb. 4, 2003.

BACKGROUND OF THE INVENTION

1. Field of the Invention

The present invention relates to a semiconductor package and method for fabricating the same.

2. Discussion of Related Art

Semiconductor packages such as ball grid array (BGA) package, chip scale package and micro ball grid array package reflect the trend towards of miniaturization and thinness in packaging. Furthermore, today's semiconductor chips are generating increasing amounts of heat during the operation of the semiconductor chip.

FIG. 16 illustrates a conventional BGA semiconductor package. A semiconductor chip 2' having a plurality of electronic circuits integrated therein and input/output pads 4' thereon is mounted at the center of the top face of a relatively thick printed circuit board 10'. An adhesive layer 91' attaches chip 2' to circuit board 10'. Printed circuit board 10' is composed of a resin film 11' as a base layer. Resin film 11' has a circuit pattern layer including bond fingers 12', connector parts 13' (e.g., conductive traces) formed on the top side thereof, and ball lands 15' in grid shape formed on the bottom side thereof. The circuit pattern layer is formed around semiconductor chip 2' in radial form. Bond fingers 12', connection parts 13' and ball lands 15' constituting the circuit pattern layer are formed from a conductive metal material such as copper or the like. Connection parts 13' located on the top of resin film 11' and ball lands 15' disposed on the bottom thereof are electrically connected to each other through a conductive via hole 14'. A portion of the top and bottom sides of resin film 11', other than the region on which bond fingers 12', ball lands 15' and semiconductor chip 2' are disposed, is coated with a cover coat 16' to protect the circuit pattern layer from external environment and prevent short-circuiting.

Moreover, input/output pads 4' of semiconductor chip 2' are connected to bond fingers 12' formed on printed circuit board 10' through conductive wires 6'. The upper side of printed circuit board 10', including semiconductor chip 2', is encapsulated with an encapsulant 20' so as to protect semiconductor chip 2', conductive wires 6' and their bonded portions from harmful external environments. Conductive balls 30' are fused to ball lands 15' formed on the bottom face of printed circuit board 10' so as to be able to transmit electric signals between semiconductor chip 2' and a mother board (not shown) when semiconductor chip 2' is mounted on the mother board.

In such a conventional BGA semiconductor package, electric signals from semiconductor chip 2' are delivered to the mother board through input/output pads 4', conductive wires 6', bond fingers 12', connection parts 13', via hole 14', ball lands 15' and conductive balls 30' sequentially, or they are transmitted reversely. However, in the conventional BGA package, semiconductor chip 2' is mounted on the top of relatively thick printed circuit board 10', which increases the thickness of the semiconductor package and makes it unsatisfactory in applications requiring a small and thin semiconductor package. Consequently, the conventional BGA package is not suitable for small electronic devices such as cellular phone and pager.

Further, as described above, the amount of heat generated per unit volume during the operation of the semiconductor chip is relatively high, but the heat spreading efficiency is low, which deteriorates the electrical performance of the semiconductor chip and, according to circumstances, may lead to failure. There has been proposed a semiconductor package having a heat spreading plate for easily emitting heat generated during the operation of the semiconductor chip. In this case, however, mounting of the heat spreading plate increases the thickness of the semiconductor package and manufacturing cost.

Meanwhile, the currently manufactured semiconductor package is generally 5×5 mm in area and 1 mm in thickness. Accordingly, a circuit board strip capable of simultaneously fabricating tens to hundreds of semiconductor packages has not been realized so far, even though it is ideal for as many semiconductor packages as possible to be made from a single circuit board strip with a conventional size. This is because of poor wire bonding due to warpage caused by a difference in the thermal expansion coefficients between different materials constituting the circuit board strip, inferior molding, and/or damage to the semiconductor chip due to momentary discharging of static electricity accumulated during the molding process.

FIG. 17 is a bottom view illustrating a conventional semiconductor package using a circuit board unit 10' having a runner gate. With reference to FIG. 17, runner gate RG is formed at a corner of circuit board unit 10'. Runner gate RG functions as a passage through which a melted molding resin at a high temperature and pressure is poured into the package for forming a resin encapsulant 20' that protects semiconductor 2' from the external environment. Conductive balls 30 are formed as external input/output terminals after the molding step.

FIG. 18 is a cross-sectional view illustrating a molding step in the fabrication of the conventional semiconductor package. Referring to FIG. 18, semiconductor chip 2' is mounted on printed circuit board unit 10'. Wire bonds 6' are attached between a circuit pattern formed on unit 10' and semiconductor chip 2. The assembly is located between a top die TD and bottom die BD, which is filled with melted resin encapsulant 20. Specifically, top die TD has a cavity CV with a predetermined-size space so that encapsulant 20' can encapsulate semiconductor chip 2' therein. Cavity CV is connected to a gate G and runner R (corresponding to runner gate RG of FIG. 17) to allow melted encapsulant 20' to flow from a resin port (not shown) through runner R and gate G to cavity CV. Runner gate RG is conventionally composed of a plated region using gold.

The conventional method of fabricating a semiconductor package, as mentioned above, has a shortcoming in that the runner gate should be formed on one side of the circuit board in the step of molding. This runner gate raises the manufacturing cost of the package because it is formed by plating a metal such as gold whose strength of adhesion to the encapsulant is smaller than that of the circuit board. Further, any increase in the number of or change in the location of the conductive balls 30' is limited since the ball lands cannot be formed at the runner gate region.

Moreover, providing a mold having the runner and gate with a shape corresponding to the runner gate of the circuit board, i.e., top die, can be complicated and costly. In addition, if the runner gate of the circuit board during molding, it is possible that the melted encapsulant will bleed out toward the ball lands. This obstructs the fusing of conductive balls 30' to the ball lands.

U.S. Pat. No. 5,620,928 provides another example of a conventional package.

SUMMARY OF THE INVENTION

Accordingly, the present invention is directed to a semiconductor package and method for fabricating the same that substantially obviates limitations and disadvantages of the related art.

A first objective of the present invention is to provide a very thin semiconductor package.

A second objective of the present invention is to provide a semiconductor package having excellent heat spreading performance.

A third objective of the present invention is to provide a semiconductor package having excellent heat spreading performance, wherein the backside of the chip may be grounded and marked.

A fourth objective of the present invention is to provide a method for fabricating the semiconductor package according to the first, second and third objectives.

Additional objectives, features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In one embodiment, a semiconductor package within the present invention includes: a semiconductor chip having a first face and a second face, the first face having a plurality of input/output pads formed thereon; a circuit board composed of a resin film having a first face and a second face, a circuit pattern layer including a plurality of bond fingers and ball lands, and a cover coat covering the circuit pattern layer with the plurality of bond fingers and ball lands selectively exposed, the circuit pattern layer being formed on the first face of the resin film, the circuit board having a through hole at the center thereof, the semiconductor chip being placed in the through hole; an electrical conductor such as bondwires that electrically connects the input/output pads of the semiconductor chip to the bond fingers of the circuit board; an encapsulant for encapsulating the semiconductor chip, connection means and a part of the circuit board; and a plurality of conductive balls fused to the circuit board. Such a package may be very thin.

In the various embodiments of packages within the present invention, the second face of the semiconductor chip in the semiconductor package may be externally exposed, or a metal thin film may be formed on the second face of the semiconductor chip and/or the second face of the resin film, or a heat spreading plate is formed on the second face of the resin film. Such packages provide excellent heat spreading performance.

In other package embodiments within the present invention, the second face of the semiconductor chip and the second face of the resin film of the semiconductor packages are covered by a metal thin film or conductive ink marking, which allows an electrical connection thereof to a ground voltage supply or some other voltage supply.

The present invention also provides a method for fabricating a semiconductor package. One embodiment within the present invention includes the steps of: providing a circuit board having a plurality of bond fingers and ball lands, the circuit board having a through hole formed at the center thereof; locating a semiconductor chip having a plurality of input/output pads at one face thereof in the through hole of the circuit board; electrically connecting the input/output pads of the semiconductor chip to the bond fingers of the circuit board through an electrical conductor such as bond wires; encapsulating the semiconductor chip, conductors, and a predetermined region of the circuit board with an encapsulant; and fusing conductive balls to the ball lands of the circuit board, to form input/output terminals.

Another embodiment of a method within the present invention for fabricating a plurality of semiconductor packages includes steps of: providing a resin film and a matrix type circuit board strip for the semiconductor packages, the resin film forming a main strip, the main strip being composed of a plurality of substrips connected in one body, each substrip having a plurality through holes, equally spaced apart, each through hole being a region where a semiconductor chip will be placed, the circuit board strip having a conductive circuit pattern formed on the resin film; attaching a closing means to one face of the circuit board strip so as to close all the through holes formed in each substrip thereof; locating the semiconductor chip in each through hole, to attach it onto the closing means; connecting the semiconductor chip and the circuit pattern to each other through an electrical conductor; charging the through holes with an encapsulant for protection of the semiconductor chip and connection means from external environment; removing the closing means from the circuit board strip; fusing conductive balls as external input/output terminals; and cutting the portion of the resin film around each through hole, to separate the semiconductor packages.

In one embodiment of the above method, the closing means has an opening as a mold gate. In another alternative embodiment, a mold gate G is formed above a cavity CV of a top die TD so as to minimize wire sweeping phenomenon during molding process.

The circuit board may have a metal thin film on the second face of the resin film. The circuit pattern layer formed on the first face of the resin film may be connected to the metal thin film formed on its second face through a conductive via hole. Further, a cover coat may be formed on the metal thin film formed on the second face of the resin film. Alternatively, a heat spreading plate may be formed on the second face of the resin film.

The circuit board may have the circuit pattern layer having the plurality of ball lands formed on the second face of the resin film. In such an embodiment, the circuit pattern layer formed on the first face of the resin film is connected to the circuit pattern layer having the plurality of ball lands formed on its second face through a conductive via hole. Further, a cover coat may be formed on the circuit pattern layer formed on the second face of the resin film exposing the lands. A heat spreading plate may be placed on the second face of the circuit board.

The semiconductor packages described above can be constructed in such a manner that the first face of the semiconductor chip and the face of the circuit board on which the bond fingers are formed face the same direction, and the second face of the semiconductor chip, the face of the circuit board on which the bond fingers are not formed and one face of the encapsulant are in the same plane.

An insulating film may be attached to the second face of the semiconductor chip, the face of the circuit board on which the bond fingers are formed and one face of the encapsulant. The insulating film may be an ultraviolet tape whose adhesion characteristic is weakened or lost when ultraviolet rays are irradiated thereto.

A conductive metal thin film may be attached to the second face of the semiconductor chip, the face of the circuit board on which the bond fingers are not formed and one face of the encapsulant. The conductive metal thin film may be formed from copper.

The first face of the semiconductor chip and the face of the circuit board on which the bond fingers are formed may face the same direction, and the second face of the semiconductor chip, one face of the heat spreading plate formed one side of the circuit board and one face of the encapsulant may be in the same plane.

An insulating film may be attached to the second face of the semiconductor chip, one face of the heat spreading plate formed one side of the circuit board and one face of the encapsulant, which are located in the same plane. The insulating film may be an ultraviolet tape.

A conductive metal thin film may be attached to the second face of the semiconductor chip, one face of the heat spreading plate formed on one side of the circuit board and one face of the encapsulant which are located in the same plane. The conductive metal thin film may be formed from copper.

A conductive ink film with a design may be formed on the second face of the semiconductor chip, one face of the encapsulant and a part of the face of the circuit board on which the bond fingers are not formed which form the same plane.

The conductive ink film having a design can be formed on the second face of the semiconductor chip, one face of the heat spreading plate formed on one side of the circuit board and one face of the encapsulant which are located in the same plane.

The conductive ink film having a design can be formed only on the second face of the semiconductor chip, a part of one face of the heat spreading plate formed on one side of the circuit board and one face of the encapsulant which are located in the same plane.

The conductive balls may be fused to the ball lands formed on the second face of the resin film of the circuit board.

There is explained below a circuit board strip used for the method of fabricating a semiconductor package of the present invention. A ground ring may be electrically connected to at least one circuit line constituting the circuit pattern. The ground plane is exposed out of the cover coat and electrically connected to the ground ring.

The closing means, such as cover lay tape, can be attached to one face of the circuit board strip constituting the main strip. Separate closing means may be attached to the substrips in one-to-one relation with them. One side of each of the separate closing means covers a slot formed between neighboring substrips. Alternatively, a single one-body closing means having a similar size to the circuit board strip, the one-body closing means having a cutting pin hole line located between neighboring substrips corresponding to the slot. The above designs minimize the warpage cause by a difference in coefficient of the thermal expansion which increases with the length, previously preventing detects generated during the fabrication of the semiconductor package.

The closing means has an opening as a mold gate for each package, the opening being formed at a part of the region disposed between the edge of the area where the semiconductor chip is mounted and the edge of each of the through holes within each substrip. The opening has a shape selected from circular, square and bent rectangular forms, but the present invention is not restricted to these shapes.

In the method for fabricating a semiconductor package to achieve the fourth objective of the present invention, a through hole closing means may be attached to the face of the circuit board on which the bond fingers are not formed before the step of providing the circuit board.

The closing means can be removed before the step of fusing the conductive balls to the ball lands of the circuit board to form the input/output terminals.

The closing means can be also removed after the step of fusing the conductive balls to the ball lands of the circuit board to form the input/output terminals.

The closing means may be an insulating film, e.g., an ultraviolet tape, or a conductive metal thin film, e.g., copper.

According to the method for fabricating a semiconductor package of the present invention as described above, the semiconductor chip is located inside the through hole having a predetermined width formed on the circuit board. Accordingly, the thickness of the semiconductor chip is offset by that of the circuit board to make the semiconductor package remarkably thin. Further, one face of the semiconductor chip is directly exposed out of the encapsulant, to increase heat radiation, improving thermal and electrical performance of the semiconductor chip.

In addition, since the heat spreading plate or metal thin film can be formed one face of the circuit board or one side of the circuit board including the one side of the semiconductor, one side of the semiconductor chip can be protected from external environment and its heat radiation performance can be improved. Further, the metal thin film or conductive ink film is formed to ground the semiconductor chip without being electrically separated, raising the electrical performance thereof.

Meanwhile, the mold runner gate is not formed on the face of the circuit board on which the circuit pattern is formed so as to allow the number of the ball lands of the circuit pattern to be as many as possible. The mold runner gate may be formed on the face of the closing means on which the circuit pattern is not formed. This enables free designing of the mold runner.

In the step of removing the closing means, a punch may be used to perforate through the slot formed between neighboring substrips to separate one side of the closing means from the circuit board strip.

The circuit board strip is formed in such a manner that the plural substrips having the plurality of through holes are interconnected. Thus, tens to hundreds of semiconductor packages can be simultaneously fabricated using a single circuit board strip. Further, the punch perforates through the slot to easily and safely remove the cover lay tape, preventing or minimizing damages in the circuit board strip. Moreover, the ground ring or ground plane is formed on the circuit board strip so as to prevent the accumulation of static electricity in the step of molding. This effectively solves various problems including damage to the semiconductor chip and circuit pattern of the circuit board strip due to momentary discharging of static electricity.

It is to be understood that both the foregoing general description and the following detailed description are exemplary and explanatory and are intended to provide further explanation of the invention as claimed.

DETAILED DESCRIPTION OF THE EXEMPLARY EMBODIMENTS

Reference will now be made in detail to various exemplary embodiments of the present invention.

Figure 1:
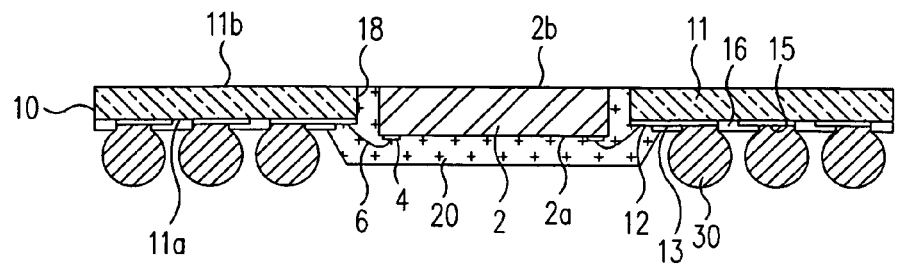
FIGS. 1 to 9 are cross-sectional views illustrating embodiments of semiconductor packages in accordance with the present invention.

FIGS. 1 to 9 are cross-sectional views illustrating various types of semiconductor packages in accordance with the present invention. Referring to FIG. 1, the semiconductor package is provided with a semiconductor chip 2 having a bottom first face 2a and a top second face 2b. First face 2a has a plurality of input/output pads 4 formed thereon. Semiconductor chip 2 is placed in a through hole 18 having a predetermined width in a circuit board 10. Through hole 18 is wider than first and second faces 2a and 2b of semiconductor chip 2. Circuit board 10 is composed of a resin film 11 having a bottom first face 11a and top second face 11b. Through hole 18 is perforated through the operation of circuit board 10 where semiconductor chip 2 is to be located. First face 11a of resin film 11 has plural conductive circuit pattern layers including ball lands 15 formed thereon. The circuit pattern layers correspond to bond fingers 12, connection parts 13 and ball lands 15, sequentially formed from the vicinity of through hole 18, all of which are made of a conductive material such as copper (Cu).

Bond fingers 12 may be plated with gold (Au) or silver (Ag) and ball lands 15 may be plated with gold (Au), silver (Ag), nickel (Ni) or palladium (Pd) for easy bonding with a connection means 6 and a conducting ball 30, respectively. Resin film 11 may be formed from a hard BT (bismaleimide triazine) epoxy resin. The circuit pattern layers are covered with a cover coat 16, with bond fingers 12 and ball lands 15 selectively exposed, to be protected from external physical, chemical, electrical and mechanical shocks. Cover coat 16 may be formed from a general insulating high polymer resin. Input/output pads 4 of semiconductor chip 2 and bond fingers 12 among circuit pattern layers of circuit board 10 are electrically connected to each other through connection means 6. Here, conductive wires such as gold wires or aluminum wires or leads are used as connection means 6.

Semiconductor chip 2, through hole 18, connection means 6, and a portion of circuit board 10 are encapsulated with an encapsulant 20 so as to be protected from the external physical, chemical and mechanical shocks. Encapsulated 20 may be formed from an epoxy-molding compound by use of a mold or a liquid epoxy resin using a dispenser. In this embodiment, the encapsulated structure is formed so as to have second face 2b of semiconductor chip 2 exposed. Plural conductive balls 30 made of Sn, Pb or compound thereof are adhesively fused to ball lands 15 among circuit pattern layers of circuit board 10, so that the package may be mounted on a motherboard (not shown). Here, first face 2a of semiconductor chip 2 and the face of circuit board 10 on which bond fingers 12 are formed face the same direction, and second face 2b of semiconductor chip 2 and second face 11b of resin film 11 are in the same plane, achieving a thin semiconductor package. Further, second face 2b of semiconductor chip 2 is exposed out of encapsulant 20 to externally spread heat generated from semiconductor chip 2 with ease.

For ease of description, only the differences between the semiconductor packages disclosed below and the semiconductor package of FIG. 1 will be described because they have similar structures.

Figure 2:
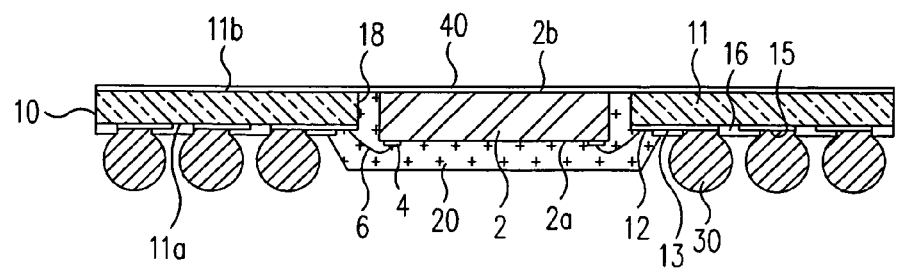

Referring to FIG. 2, an insulating film 40 as a closing means is additionally attached to the co-planar portions of second face 2b of semiconductor chip 2, one face of encapsulant 20 (the top side in the figure) and second face 11b of resin film 11 to temporarily fix semiconductor chip 2 during its fabrication, protect second face 2b of semiconductor chip 2 from external environments and, simultaneously, and eliminate the possibility of the bleeding out of encapsulant 20 toward second face 2b during fabrication processes that will be explained later. Further, an ultraviolet sensitive tape may be used as insulating film 40 so as to allow film 40 to be easily detached when ultraviolet rays are irradiated thereon.

Figure 3:
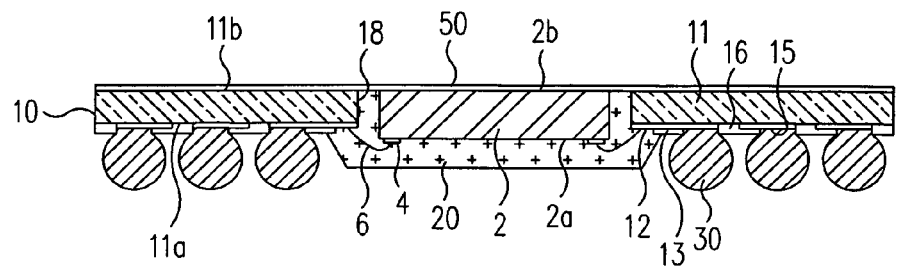

In FIG. 3, a metal thin film 50 is adhered to the co-planar portions of second face 2b of semiconductor chip 2, the top side of encapsulant 20, and second face 11b of resin film 11 to protect second face 2b from external environments and, simultaneously, prevent the encapsulant from bleeding out toward second face 2b of semiconductor chip 2 during the fabrication processes. With the use of metal thin film 50, heat generated from semiconductor chip 2 is externally emitted more easily, and the electrical performance of semiconductor chip 2 is improved, since one side thereof is directly grounded. Metal thin film 50 may be formed from copper or other metals.

Figure 4:
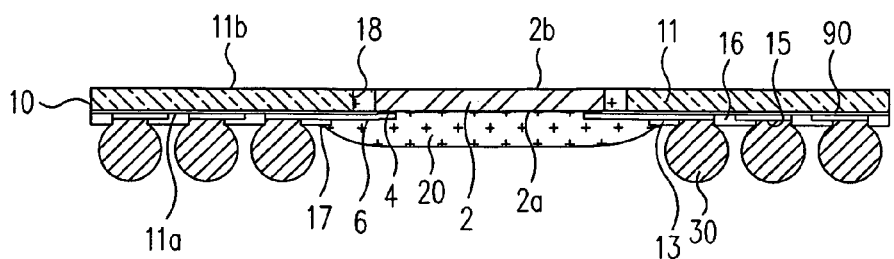

Referring to FIG. 4, first face 11a of resin film 11 may have a lead pattern attached thereto by an adhesive film 90, instead of having a conventional copper circuit pattern layer formed thereon. The lead pattern, which uses a conventional lead frame, is composed of connections parts 13 and ball lands 15 and is connected to input/output pads 4 of semiconductor chip 2 through connections means 6. An epoxy molding compound or liquid encapsulant material may be used as encapsulant 20. Reference numeral 17 in FIG. 4 indicates a dam for preventing an overflow of the liquid encapsulant when it is used as encapsulant 20. Dam 17 may be formed from an encapsulant material or metal material.

Figure 5:
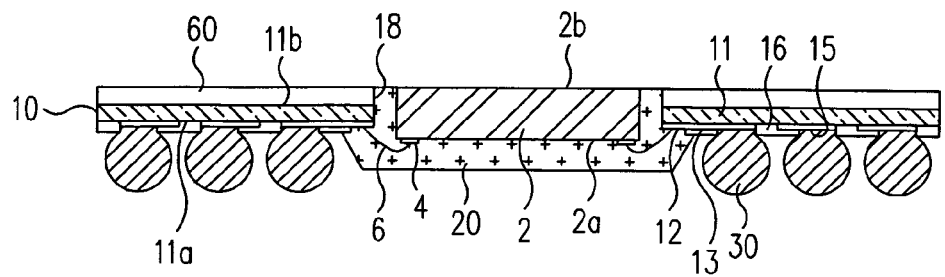

In FIG. 5, a heat spreading plate 60 may be additionally attached to second face 11*b* of resin film 11. Heat spreading plate 60 functions as not only a heat spreader of semiconductor chip 2, but also a reinforcement for preventing resin film 11 from being easily warped. Heat spreading plate 60 may be formed from copper or aluminum. Heat spreading plate 60 may be applied to all the semiconductor packages mentioned herein, including those of FIGS. 1 to 4 and FIGS. 6 to 9.

In FIG. 5, first face 2*a* of semiconductor chip 2 and the side of circuit board 10 on which bond fingers 12 are formed face the same direction. Second face 2*b* of semiconductor chip 2, the upper face of heat spreading plate 60 opposite circuit board 10, and one face of encapsulant 20 are located in the same plane. Further, an insulating film (not shown) may be additionally attached to this plane (including second face 2*b* of semiconductor chip 2, the upper face of heat spreading plate 60, and one face of encapsulant 20). This insulating film can be applied to the semiconductor packages shown in FIGS. 1, and 3 to 8 in addition to the one shown in FIG. 2.

Figure 6:
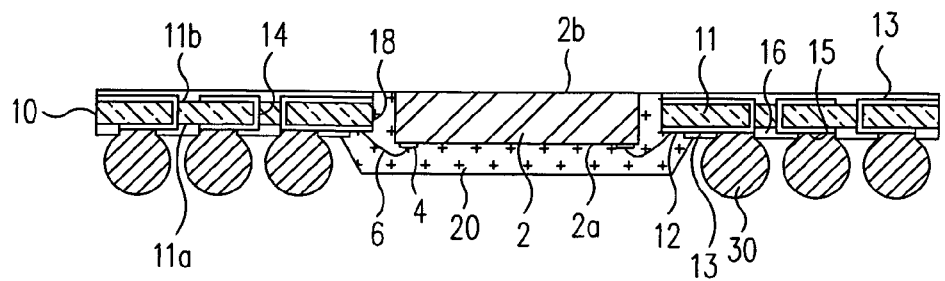
Figure 6A:
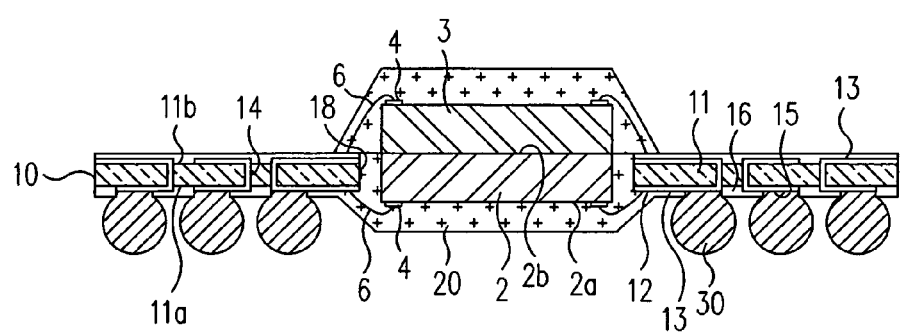

Referring to FIG. 6, a predetermined circuit pattern layer can be formed on second face 11*b* of resin film 11 (BT epoxy resin film), as well as on first face 11*a* thereof. Specifically, first face 11*a* of resin film 11 has the circuit pattern layer composed of bond fingers 12, connection parts 13 and ball lands 15 formed thereon, and second face 11*b* also has a circuit pattern layer including connection parts 13 formed thereon. Here, the circuit pattern layers formed on first face 11*a* and second face 11*b* of resin film can be connected to each other through a conductive via hole 14. Moreover, cover coat 16 can be additionally selectively coated on the circuit pattern layer formed on second face 11*b* of resin film 11 to protect it from external environments. In this embodiment, a layer of cover coat 16 is coated on second face 11*b* of resin film 11, second face 2*b* of semiconductor chip 2 and the top side of encapsulant 20. As shown in FIG. 6A, two semiconductor chips 2, 3 can be included back to back, with bond wires 6 attached respectively to the first or second circuit patterns.

Figure 7:
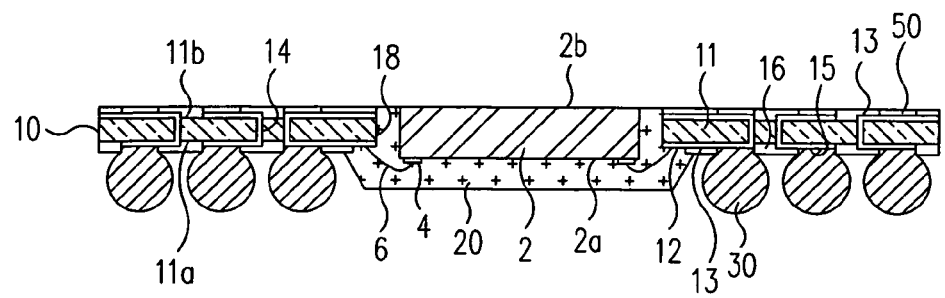
Figure 7A:
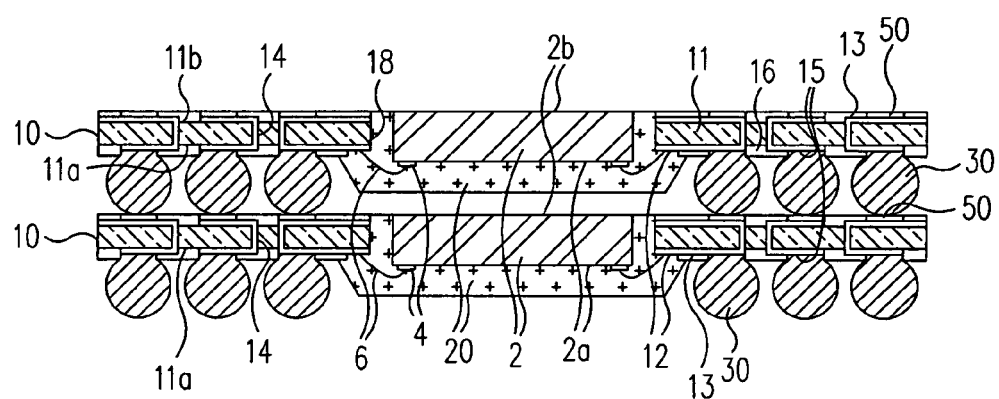

Referring to FIG. 7, a plurality of ball lands 15 may be additionally formed at connection parts 13 of the circuit pattern layer formed on second face 11*b* of resin film 11. In this case, similar to the case of FIG. 6, the circuit pattern layer formed on first face 11*a* of resin film 11 and the circuit pattern layer formed on its second face 11*b* can be connected to each other through conductive via hole 14. Ball lands 15 are exposed out of cover coat 16, meaning that plural semiconductor packages can be subsequently laminated. Conductive balls 30 of another package may be adhesively fused to the ball lands 15 formed on second face 11*b* of resin film 11, enabling a vertical stacking and electrical interconnection of the semiconductor packages, as shown in FIG. 7A.

Figure 8:
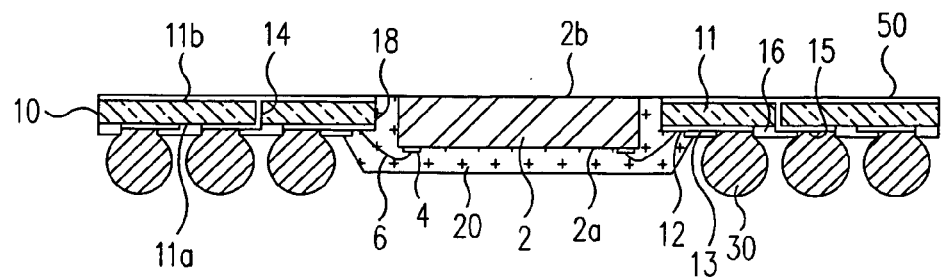

With reference to FIG. 8, second face 11*b* of resin film 11 can have metal thin film 50, instead of the fine circuit pattern layer, formed thereon. In this case, a connection part 13 used for ground, among connection parts 13 formed on first face 11*a* of resin film 11, can be connected to metal thin film 50 through via hole 14. Further, a cover coat (not shown) may be additionally formed on metal thin film 50 to protect it from the external environment.

Figure 9:
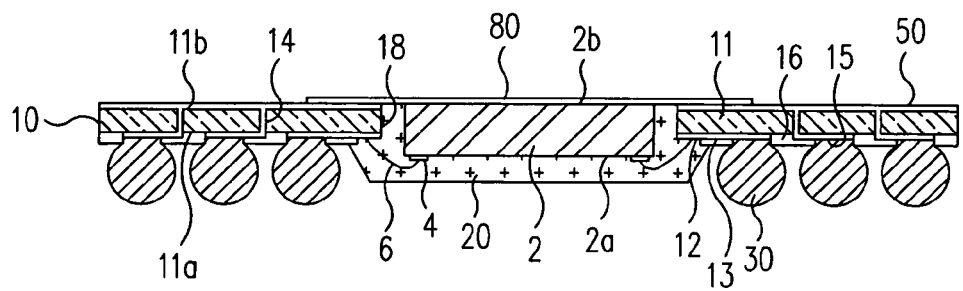

Referring to FIG. 9, similar to FIG. 8, a conductive ink film 80 with a predetermined thickness can be formed on second face 2*b* of semiconductor chip 2, the top side of encapsulant 20 and the surface of metal thin film 50. Conductive ink film 80 may be formed on the overall surface of the semiconductor package shown in FIG. 1, that is, second face 2*b* of semiconductor chip 2, the top side of encapsulated 20 and second face 11*b* of resin film 11, or only a part thereof including second face 2*b* of semiconductor chip 2. This conductive ink film 80 can also be applied to all of the semiconductor packages of FIGS. 2 to 8. Using conductive ink film 80, a design such as company name, product name, figure, picture, or a combination of them can be formed in positive or negative form.

FIGS. 10A to 10G are sequential cross-sectional views illustrating a method of fabricating a semiconductor package according to the present invention.

First, there is provided circuit board 10 employing resin film 11 having first face 11*a* and second face 11*b*, perforated with through hole 18 in which a semiconductor chip 2 having first face 2*a* and second face 2*b* will be placed. First face 11*a* has a conductive circuit pattern layer, including bond fingers 12, connection parts 13, ball lands 15 and the like formed thereon. The circuit pattern layer is selectively coated with cover coat 16. Bond fingers 12 and ball lands 15 are selectively exposed (FIG. 10A) through cover coat 16.

Figure 10A:
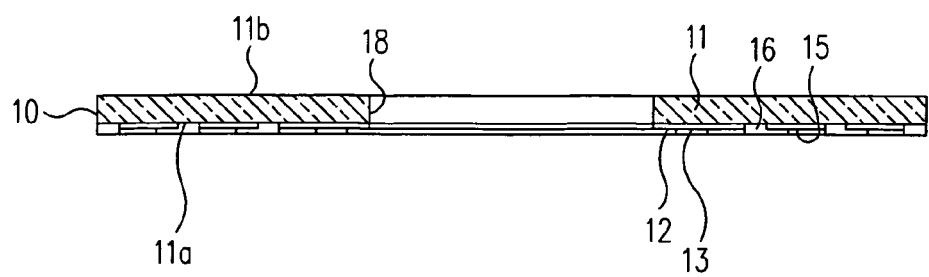
FIGS. 10A to 10G are sequential diagrams illustrating steps of an example method for fabricating a semiconductor package according to the present invention.
Figure 10B:
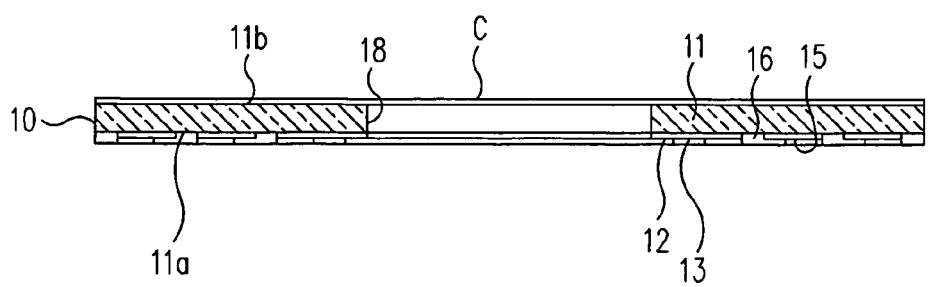

Referring to FIG. 10B, closing means C is attached to second face 11*b* of circuit board 10 so as to cover through hole 18. Through hole closing means C may be formed from an insulating tape which can be easily taken off later by heat or ultraviolet rays, or a thin metal film (e.g., a copper film).

Figure 10C:
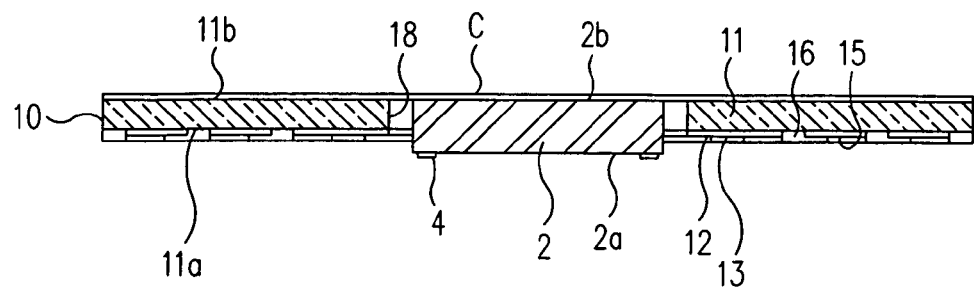
Figure 10D:
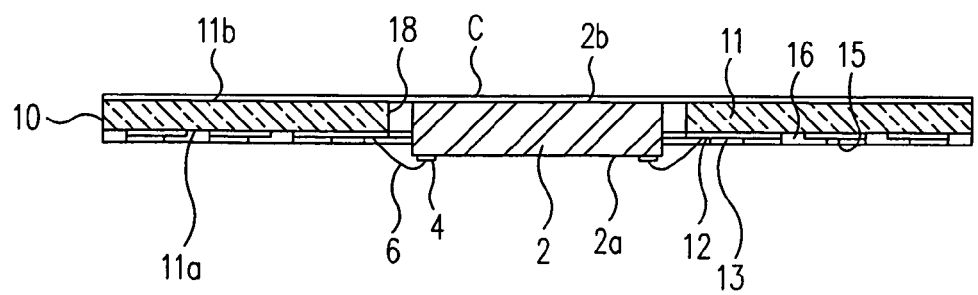

Referring to FIG. 10C, semiconductor chip 2 is located inside of through hole 18 of circuit board 10 in such a manner that its first face 2*a*, on which input/output pads 4 are formed, faces downward and its second face 2*b* comes into contact with or adheres to closing means C. Thereafter, as shown in FIG. 10D, input/output pads 4 of semiconductor chip 2 and bond fingers 12 of circuit board 10 electrically connected to each other by the use of connection means 6, i.e., conductive wires such as gold wires or aluminum wires or leads.

Figure 10E:
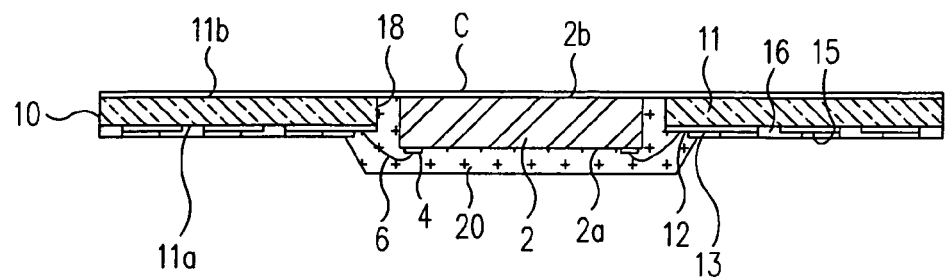
Figure 10F:
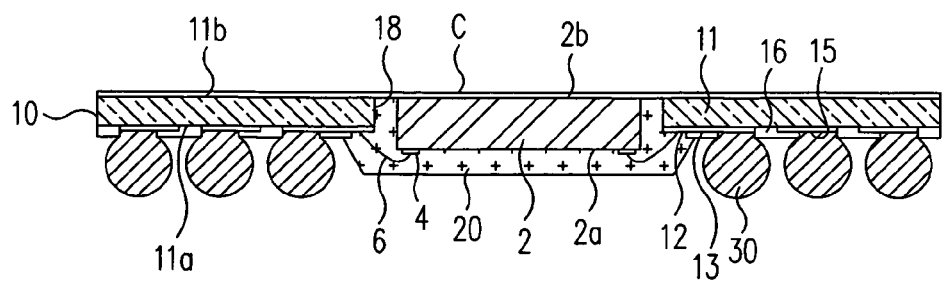

Referring to FIG. 10E, semiconductor chip 2, connection means 6 and a predetermined region of circuit board 10 on the bottom side of closing means C are encapsulated with encapsulant 20, such as epoxy molding compound or liquid encapsulant material. Then, as shown in FIG. 10F, conductive balls 30 are fused to ball lands 15 of circuit board 10 so that the package can be mounted on a mother board later. Conductive balls 30 may be fused by using screen printing, though they can be fused through various methods. That is, a flux having relatively large viscosity is dotted on ball land 15 of circuit board 10, conductive ball 30 provisionally adheres to the flux, and then circuit board 10 is loaded into a furnace, wherein fuse conductive balls 30 are adhesively fused to ball lands 15.

Figure 10G:
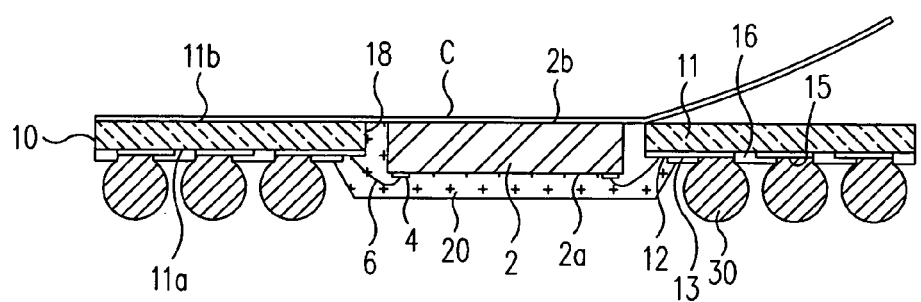

Finally, as shown in FIG. 10G, when closing means C is a tape or ultraviolet tape, heat or ultraviolet light is irradiated on the top face of circuit board 10 to enable a removal (e.g., peeling) of closing means C, thereby externally exposing the top face of semiconductor chip 2. Where closing means C is formed from a metal thin film, closing means C may be left in place. Furthermore, closing means C may be removed before conductive balls 30 are fused to ball lands 15 of circuit board 10, which is optional in the present invention.

Figure 11A:
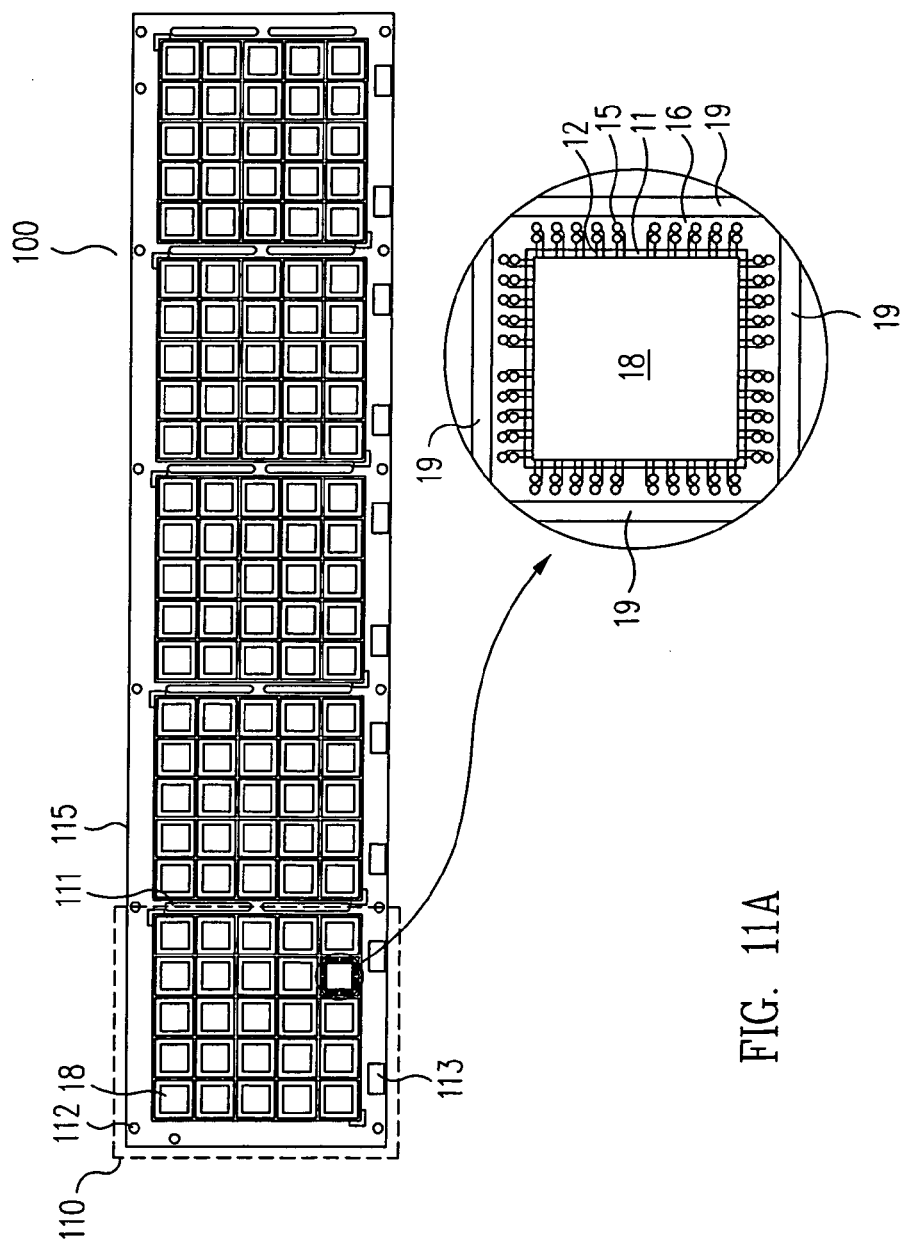
FIG. 11A is a top plan view of a circuit board strip used for making the semiconductor package of the present invention.
Figure 11B:
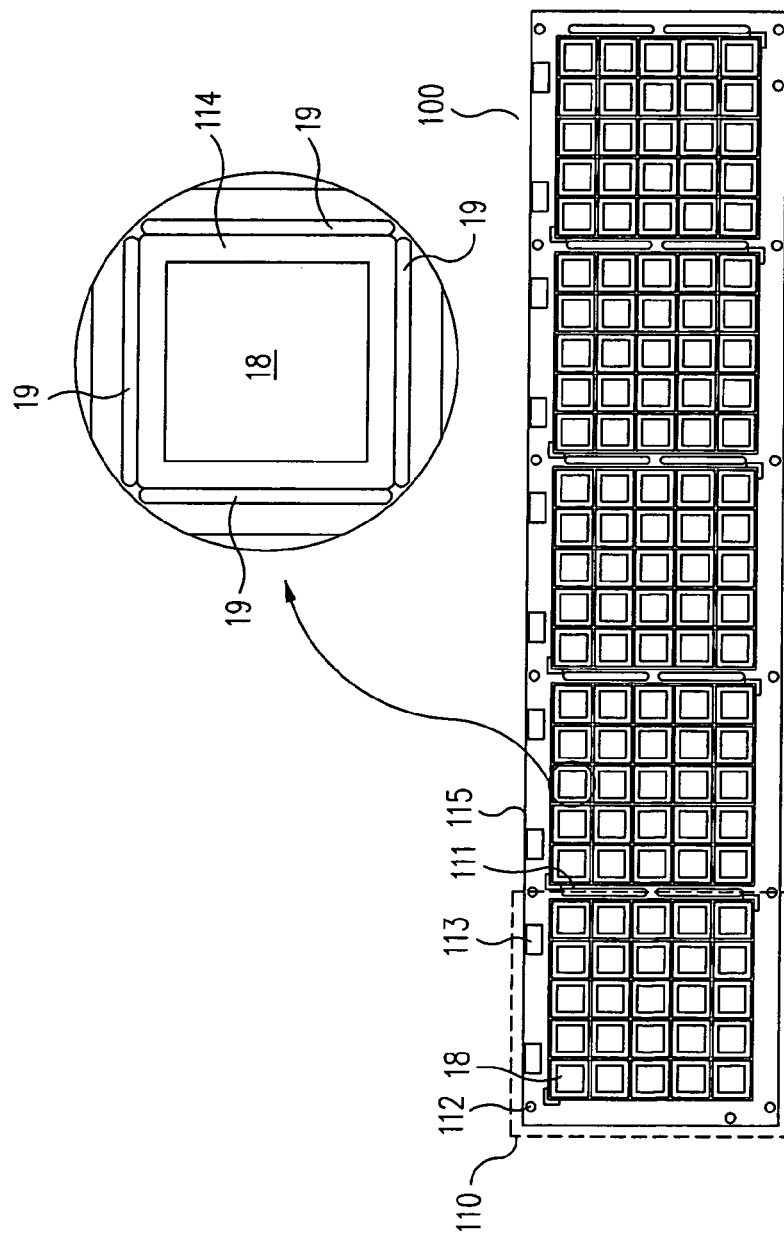
FIG. 11B is a bottom view of the circuit board strip of FIG. 11A.

FIGS. 11A and 11B are a plan view and a bottom view respectively, of a circuit board strip 100 for making semiconductor packages in accordance with the present invention. Referring to FIGS. 11A and 11B, a plurality of interconnected rectangular resin films 11, each of which is perforated with a rectangular through hole 18, and each of which has four peripheral sides adjacent to each of which is a through slot 19, are arranged in the form of matrix, equally spaced apart, at a predetermined distance, to constitute one substrip 110. The semiconductor chip (not shown) will be placed in each through hole 18 of substrip 110. A plurality of substrips 110 are horizontally connected, with a vertically-perforated slot 111 having a predetermined length therebetween, to form one main strip 115.

At a portion of the surface of resin film 11 which surrounds each through hole 18 within each substrip 110, bond fingers 12 are formed to be connected later to semiconductor chip 2 through electrical connection means 6. Ball lands 15 respectively connected to bond fingers 12 also are provided so that conductive balls 30 (e.g., solder balls) can be fused later thereto. Here, bond fingers 12 and ball lands 15 are defined as the conductive circuit pattern. The surfaces of resin film 11 and the circuit pattern are selectively coated with a high polymer resin cover coat 16. Bond fingers 12 and ball lands 15 exposed through cover coat 16. This cover coat 16 protects the circuit pattern from external unfavorable environments and provides rigidity to the entire circuit board strip 100 (with reference to FIGS. 1 to 9).

Referring to FIG. 11B, a conductive square ground ring 114 is formed on the opposite side of resin film 11 surrounding through hole 18. Ring 114 is electrically connected to at least one circuit line forming the circuit pattern. Specifically, ground ring 114 is formed on the face of resin film 11 opposite where the circuit pattern, including bond fingers 12 and ball lands 15, are formed. Ring 114 is electrically connected to the circuit pattern through a via (not shown) or the like. Such ground ring 114 grounds semiconductor chip 2 and improves the rigidity of entire circuit board strip 100. In addition, ground ring 114 may be adhered to the surface of resin film 11 using an adhesive. Ring 114 may or may not have its surface coated with cover coat 16.

Moreover, a conductive ground plane 113 having a predetermined area is formed on a surface of resin film 11 corresponding to the margin of main strip 115 of circuit board strip 100. Conductive ground plane 113 is exposed and electrically connected to ground ring 114. Ground plane 113 can be formed on both sides of resin film 11, differently from ground ring 114, and thus it is able to externally emit static electricity generated during the fabrication process through the mold. Here, although the circuit pattern, including bond fingers 12 and ball lands 15, ground ring 114 and ground plane 113, may be formed using a copper thin film, any conductive material can be used.

Figure 11C:
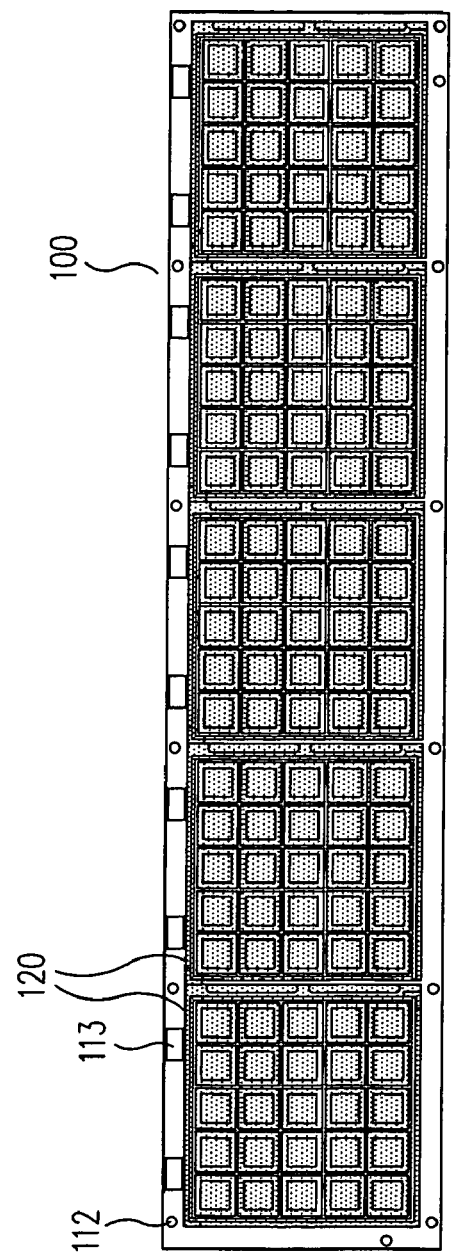
FIGS. 11C and 11D are bottom views illustrating states in which a tape is attached to the circuit board strip of FIG. 10A.
Figure 11D:
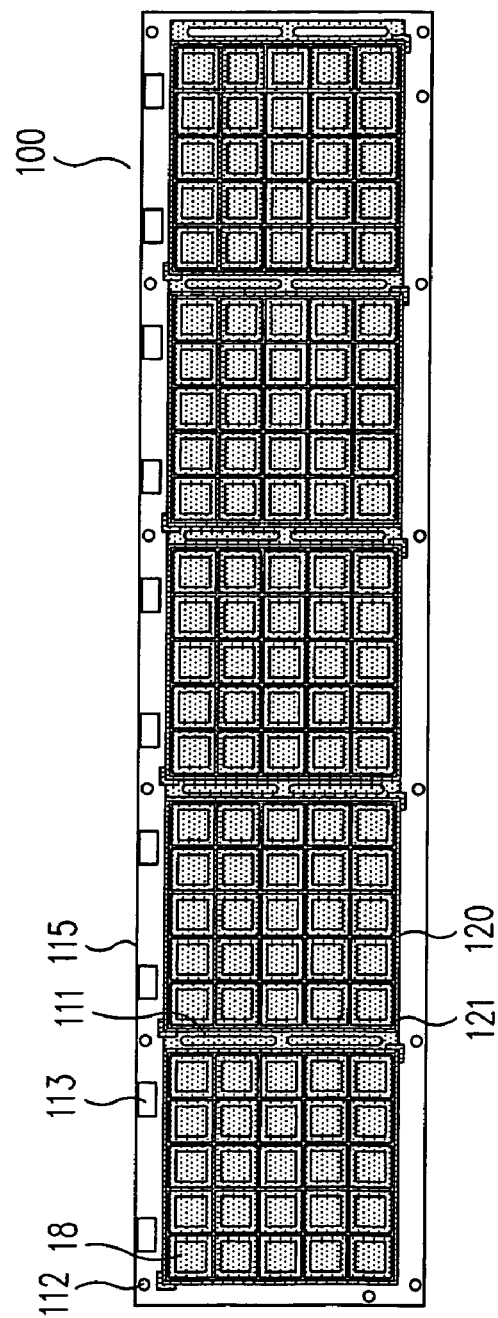

FIGS. 11C and 11D are bottom views illustrating a state in which a cover lay tape 120, as closing means C, adheres to circuit board strip 100. Cover lay tape 120 is attached to the bottom side of circuit board strip 100. Referring to FIG. 11C, cover lay tape 120 adheres to the bottom of each substrip 110. That is, a piece of cover lay tape 120 can be attached to the bottom of each substrip 110. Although it is, of course, possible to employ a cover lay tape 120 with the same size as that of main strip 115, using cover lay tapes 120 each sized to attach to one face of each substrip 110 reduces a difference in the thermal expansion coefficients of the circuit board strip and cover lay tape, which increases with the length.

In general, the amount of variation due to the difference in the thermal expansion coefficients of the circuit board strip and cover lay tape, generated during wire bonding process or molding process, which require a high temperature condition, is represented by the expression DL=L×a, where "DL" indicates the amount of variation, "L" indicates the length of the tape, and "a" indicates a coefficient of variation. Accordingly, shortening of the cover lay tape's length can effectively prevent or mitigate the warpage of the circuit board strip during the high temperature processes. Further, one side of each cover lay tape 120 covers slot 111, which is formed between neighboring substrips 110. This allows for easy removal of removing cover lay tape 120 during the fabrication of the semiconductor package.

With reference to FIG. 1D, an alternative cover lay tape 120 having the same size as main strip 115 adheres to overall surface of the main strip. This cover lay tape 120 has a cutting pin hole line 121 formed at a boundary between neighboring substrips 110. The formation of cutting pin hole line 121 can mitigate bending phenomenon caused by the difference in the coefficient of thermal expansion. In one embodiment, a cutting pin hole line 121 of cover lay tape 120 is formed on slot 111, which is located at the boundary between adjacent substrips 110. Although the width of cutting pin hole line 121 is not limited, it may be narrower than the width of slot 111. This results in easy removal of cover lay tape 120 during the fabrication of a semiconductor package, as is further described below.

In other embodiments, cutting pin hole line 121 may be formed covering the overall width (vertical width in the figure) of cover lay tape 120, or may be formed at a portion thereof including slot 111. Reference numeral 112 in FIGS. 11C and 11D indicates an index hole for loading, feeding, and fixing circuit board strip 100 into various fabrication apparatuses and processes.

As mentioned above, circuit board strip 100 includes plural substrips 110, each of which has a plurality (e.g., 25) of interconnected circuit board 10 with through holes 18. Main strip 115 consists of a plurality (e.g., four) of interconnected substrips 110. Accordingly, tens to hundreds of semiconductor packages can be simultaneously fabricated using a single circuit board strip 100. Further, cover lay tape 120 is designed to be easily removed to minimize any damage to circuit board strip 100. Ground ring 114 and ground plane 113 improve the rigidity of circuit board strip 100 and dramatically reduce the effect of static electricity.

Figure 12A:
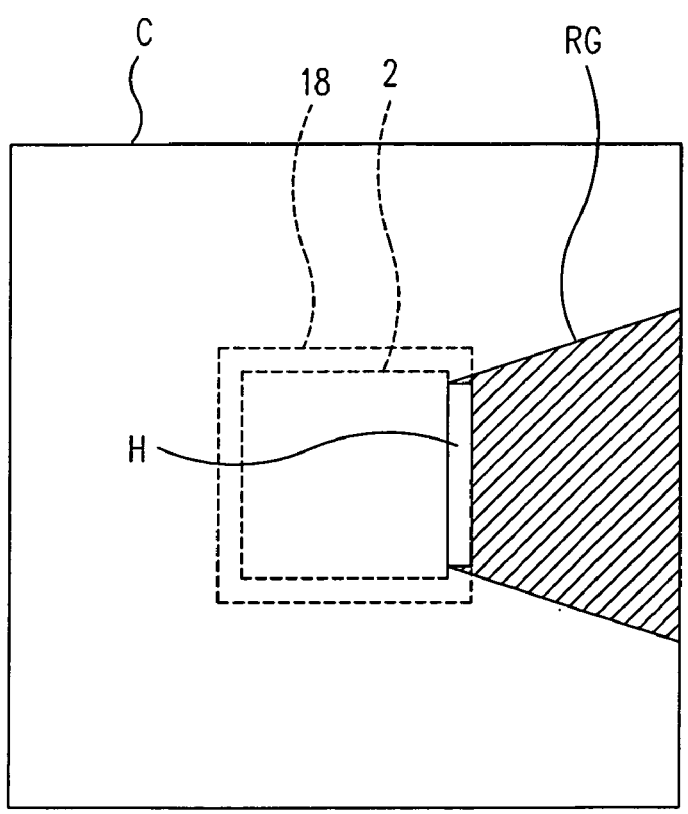
FIGS. 12A and 12B are bottom views illustrating a closing means attached to one face of the circuit board, the closing means having an opening and a runner gate.
Figure 12B:
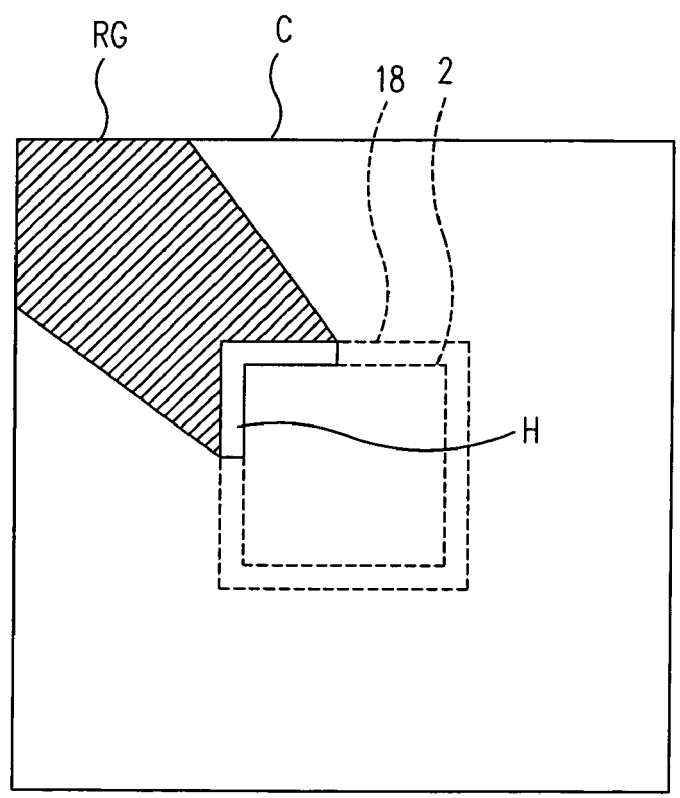

FIGS. 12A and 12B are bottom views illustrating a closing means C provided for each circuit board 10 of circuit board strip 100. Closing means C has an opening H and a runner gate RG. As shown in FIGS. 12A and 12B, closing means C is attached to one face of the circuit board to close through hole 18. Closing means C has an opening H through which encapsulant 20 encapsulates semiconductor chip 2. It is preferable to form opening H between a portion of closing means C corresponding to the edge of semiconductor chip 2 and the inner surface of through hole 18. Opening H can be formed in a variety of shapes, including a rectangular (including square) shape as shown in FIG. 12A, a bent rectangular form as shown in FIG. 12B, or a circular or oval shape.

Closing means C also has runner gate RG formed at the face thereof on which semiconductor chip 2 is not mounted, i.e., the face opposite resin substrate 11 and chip 2. Runner gate RG may be formed at a portion corresponding to a runner R and gate G of a bottom die BD in a molding process (with reference to FIG. 13, which will be described below). Closing means C may be formed from a material having a very weak adhesion strength of encapsulant 20, which characteristic is not changed even at the high temperatures (around 300° C.) of a molding die.

After circuit board 10 is provided (for example, in the arrangement of circuit board strip 100), closing means C as described above is attached to one face thereof. Subsequently, the adhesion of semiconductor chip 2, wire bonding and encapsulation processes are performed. However, closing means C can be adhered to the circuit board in any step if it is previous to the encapsulation step. Runner gate RG of closing means C may be plated with gold whose adhesive strength to encapsulant 20 is smaller than that of the circuit board for smooth flow of encapsulant 20. Accordingly, runner gate RG is not directly formed on the circuit board 10 so that conductive balls 30 can be fused on the overall surface of the circuit board, which allows a greater number of conductive balls 30 to be mounted hereon than could be done using the prior art methods described above.

Figure 13:
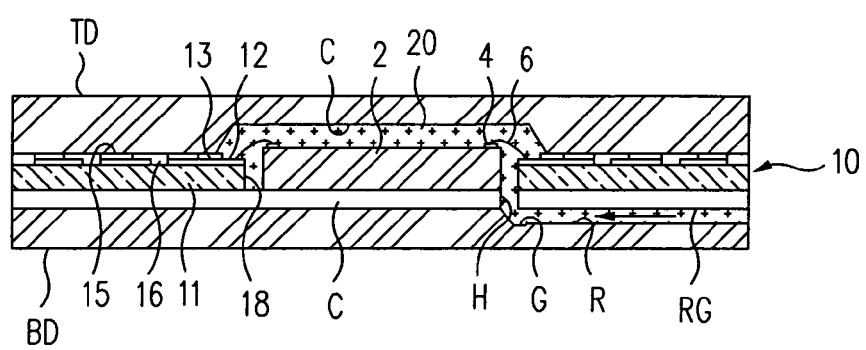
FIG. 13 is a cross-sectional view illustrating an example of a molding step in the fabrication of a semiconductor package of the present invention.

FIG. 13 is a cross-sectional view illustrating a molding step of a method according to the present invention. Referring to FIG. 13, a top die TD has a cavity CV having a predetermined-size space while a bottom die BD has a mold runner R and a mold gate G which correspond to a mold runner gate RG disposed on the bottom side of closing means C. Here, gate G of bottom die BD must be located corresponding to opening H formed in closing means C. Accordingly, encapsulant 20 flows along runner R and gate G of bottom die BD and through opening H of closing means C into cavity CV of top die TD, thereby encapsulating the package.

Adoption of the circuit board structure and molding method as described above allows the mounting of a large number of conductive balls on the circuit board of the semiconductor package. This improves the performance of the package and enables unrestricted designing of the circuit board. Further, since the width of the mold runner gate can be freely extended, there is no obstacle to molding packages built on a matrix type circuit board strip having tens to hundreds of units.

Figure 14:
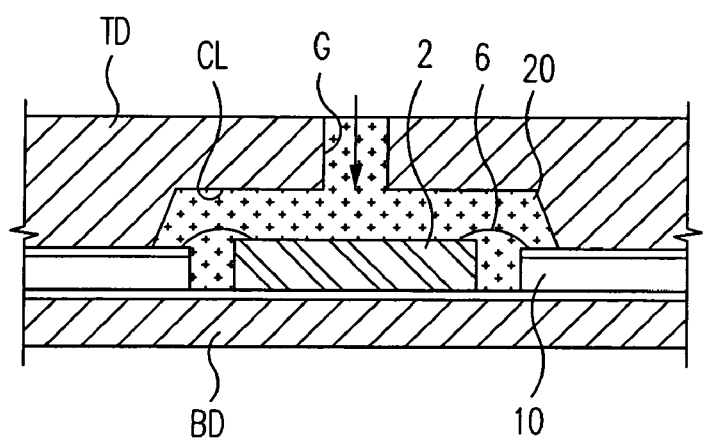
FIG. 14 is a cross-sectional view illustrating another example of a molding step in the fabrication of a semiconductor package of the present invention.

FIG. 14 is a cross-sectional view illustrating another molding step of a method according to the present invention. Referring to FIG. 14, top die TD has cavity CL having a predetermined-size space, and bottom die BD has semiconductor chip 2 mounted thereon and is located on circuit board 10 electrically connected to semiconductor chip 2 through bonding wires 6. Top die TD and bottom die BD are combined, facing each other, to form closed cavity CV. The mold structure of FIG. 14, unlike the mold structure shown in FIG. 13, has a mold gate G with a predetermined diameter above cavity CV.

Accordingly, there is no need to form mold gate G or mold runner R on circuit board 10 or closing means C, resulting in reduction in the manufacturing cost and improvement in process efficiency. Further, the molding resin is poured into cavity CV through an orifice at the top of die TD so that the wire sweeping phenomenon is minimized. Accordingly, there is no obstacle to molding a matrix type circuit board strip having tens to hundreds of units.

FIGS. 15A to 15H are sequential diagrams illustrating a method for fabricating a semiconductor package of the present invention.

Figure 15A:
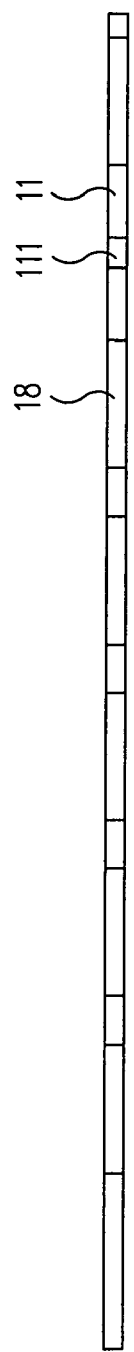
FIGS. 15A to 15H are sequential diagrams illustrating a method of fabricating a semiconductor package according to the present invention.

Referring to FIGS. 11A, 11B and 15A, there is provided a matrix type circuit board strip 100 having a plurality of substrips 110 with a perforated slot 111 of a predetermined length therebetween. Circuit board strip 100 has a base formed of resin film 11. Each substrip 110 includes a matrix of equally spaced circuit boards 10 with through holes 18 formed through a central portion thereof. A semiconductor chip 2 will be mounted in each through hole 18. A conductive circuit pattern, composed of bond fingers 12 and ball lands 15, to which semiconductor chip 2 will be electrically connected through connection means 6 and conductive balls 30, is provided on the portion of the surface of resin film 11 around through hole 18 of each circuit board 10 within each substrip 110. A cover coat 16 is selectively coated on resin film 11 and the surface of the circuit pattern. Bond fingers 12 and ball lands 15 are exposed through cover coat 16.

Figure 15B:
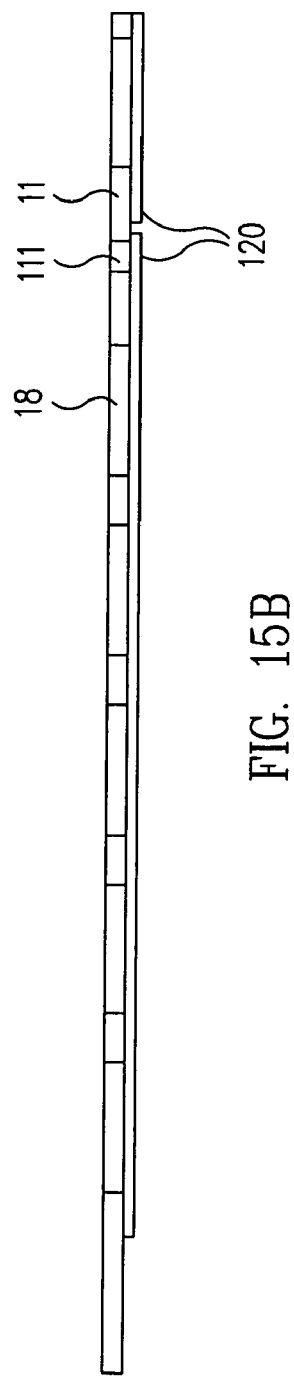
Figure 15B:
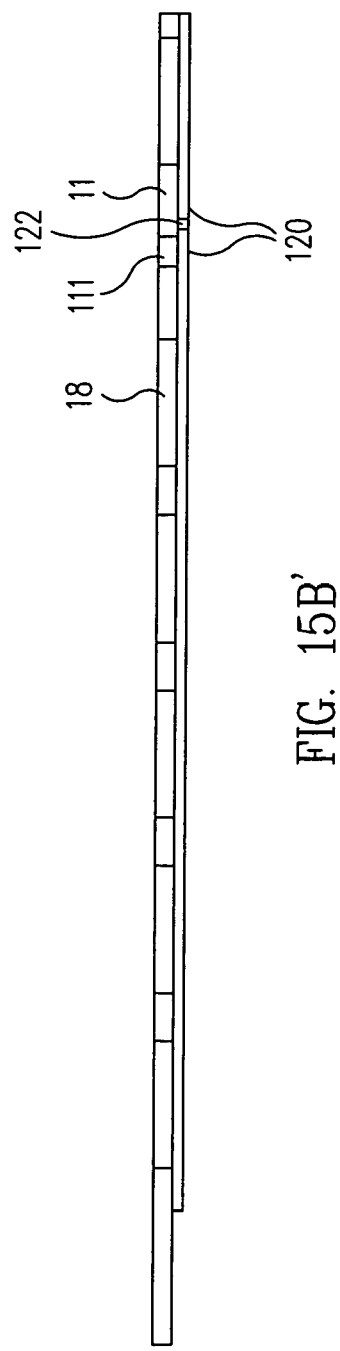

Referring to FIGS. 15B and 15B', a closing means, in particular, cover lay tape 120, is attached to one face of each substrip 110 of circuit board strip 100 to close all through holes 18 formed therein. In the example shown in FIG. 15B, cover lay tape 120 independently adheres to one side of each substrip 110. That is, plural cover lay tapes 120, equally spaced apart, are attached in one to one relation with plural substrips 110. This reduces the difference in the thermal expansion coefficients between them which increases with the length, to mitigate or prevent the warpage of circuit board strip 100 during the fabrication of the semiconductor package. Further, cover lay tape 120 is attached in such a manner that one side thereof covers slot 111 formed between neighboring substrips 110.

In the example shown in FIG. 15B', one-body cover lay tape 120 having a similar size to circuit board strip 100 adheres to one side of strip 100, having cutting pin hole line 121 at a portion corresponding to slot 111 located between neighboring substrips 110, cutting pin hole line 121 (FIG. 11D) consisting of a plurality of pin holes 122 for cutting. These cutting pin holes 122 can mitigate or prevent the warpage phenomenon caused by the difference in the thermal expansion coefficients.

Figure 15C:
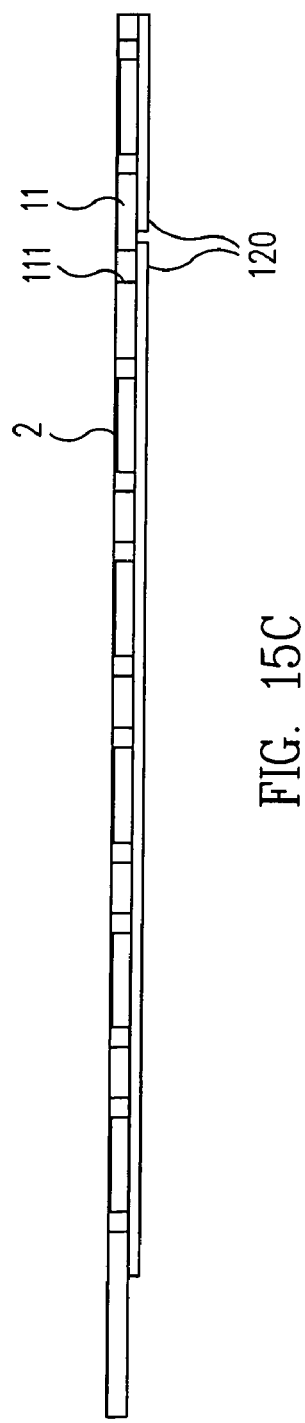
Figure 15D:
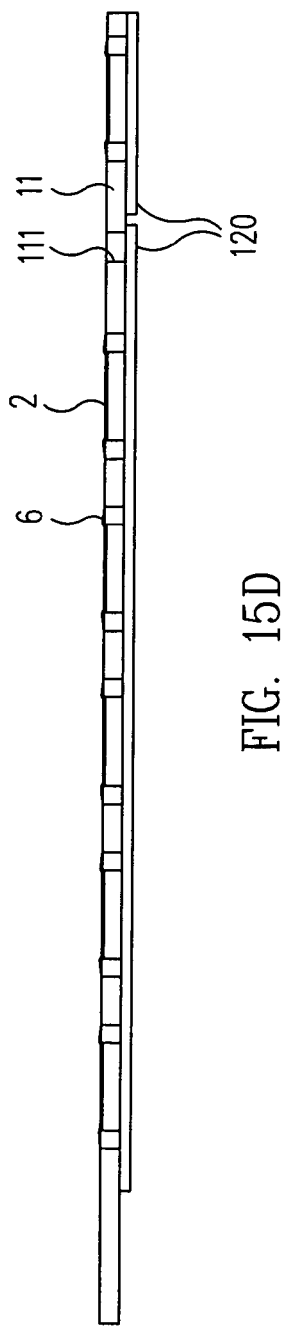
Figure 15E:
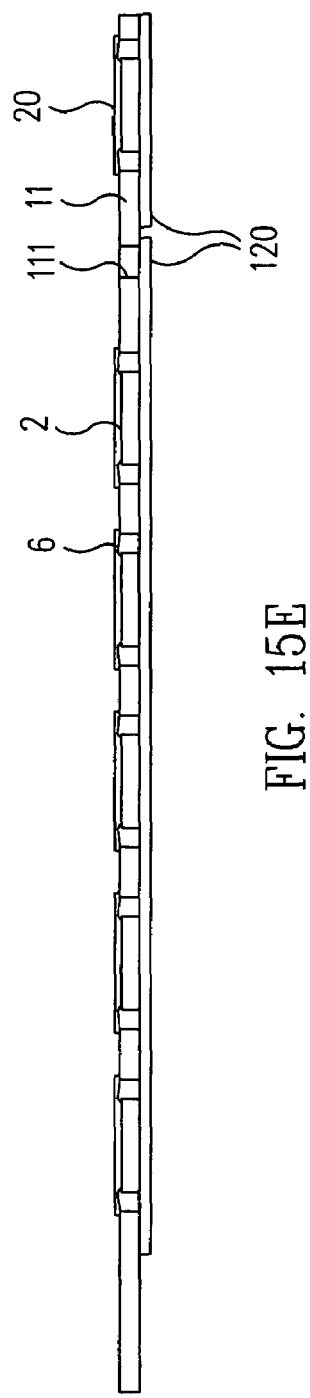
Figure 15F:
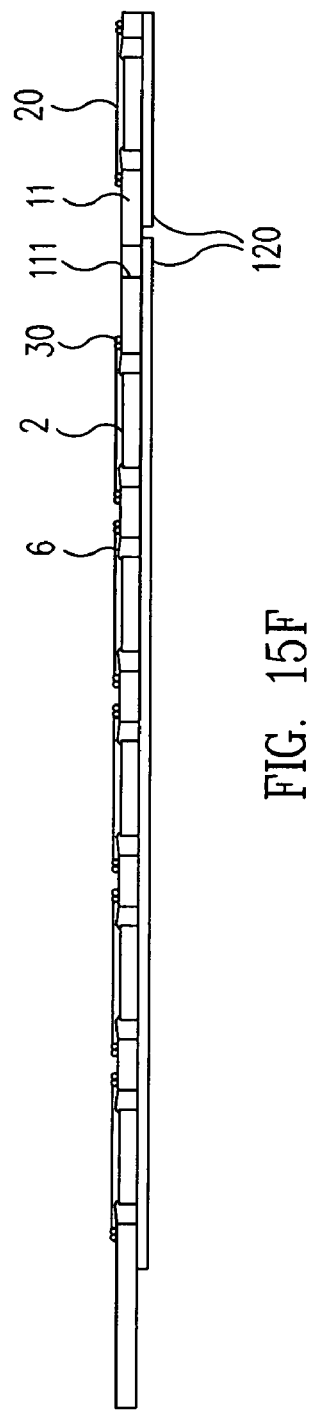

Subsequently, a semiconductor chip 2 is placed in each of through holes 18 formed in circuit board strip 100 in such a manner that one face thereof is attached to cover lay tape 120 (FIG. 15C). Then, semiconductor chip 2 is connected to bond fingers 12 formed around through hole 18 by the use of electrical connection means 6, such as gold wire and aluminum wire (FIG. 15D). Through hole 18 is molded with encapsulant 20, such as epoxy molding compound or liquid epoxy encapsulant, to protect semiconductor chip 2 and connection means 6 from the external environment (FIG. 15E). Conductive balls 30 such as solder balls are fused to ball lands 15 formed around each through hole 18 (FIG. 15F).

Figure 15G:
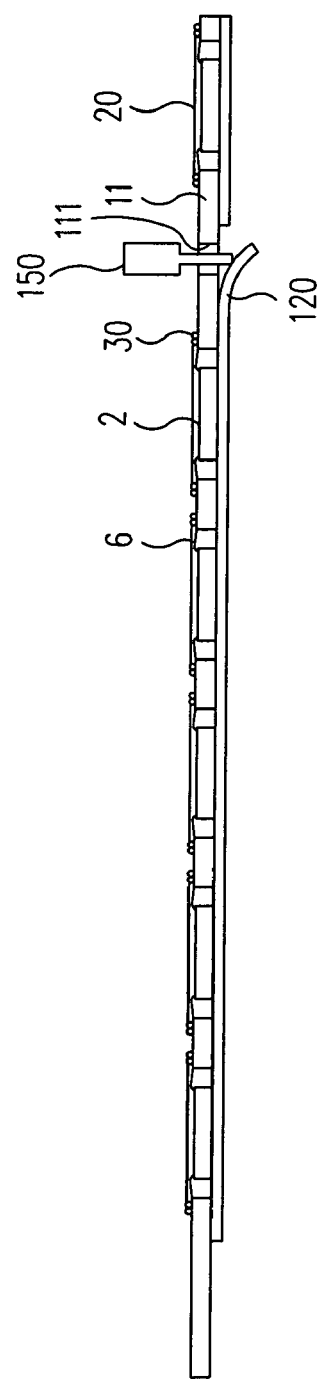
Figure 15H:
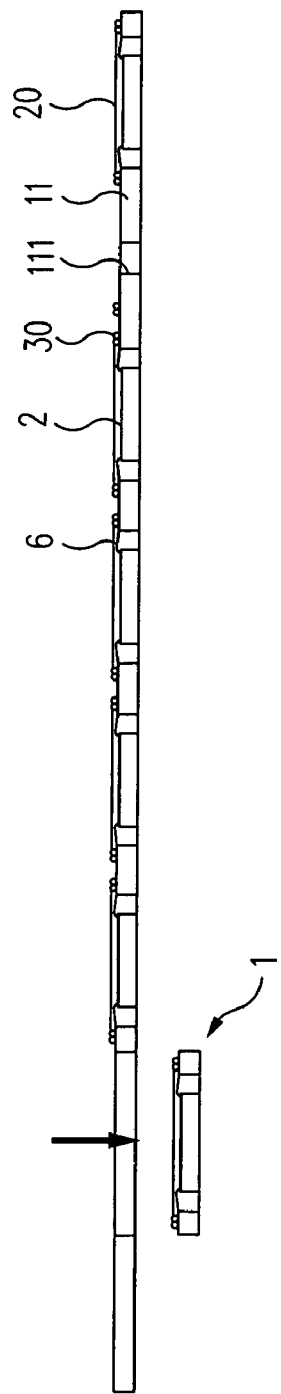
Figure 16:
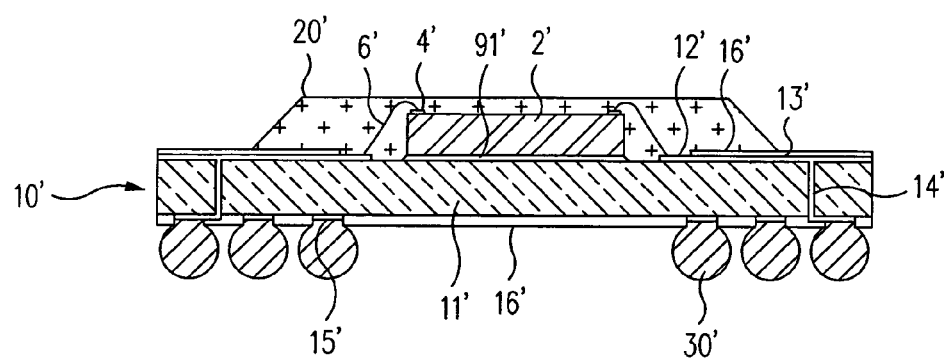
FIG. 16 is a cross-sectional view illustrating a conventional package.
Figure 17:
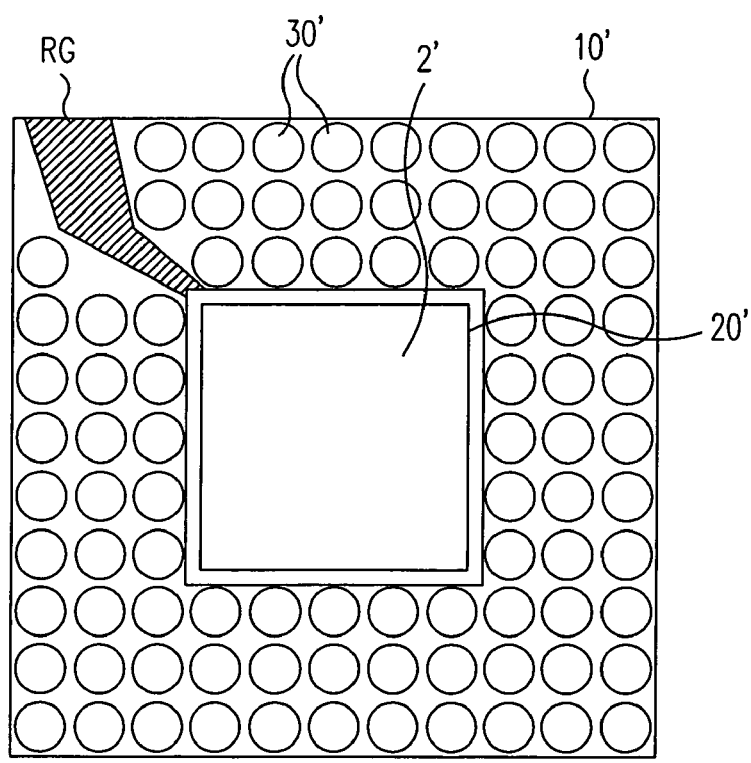
FIG. 17 is a bottom view of a conventional semiconductor package using a circuit board unit on which a runner gate is formed.
Figure 18:
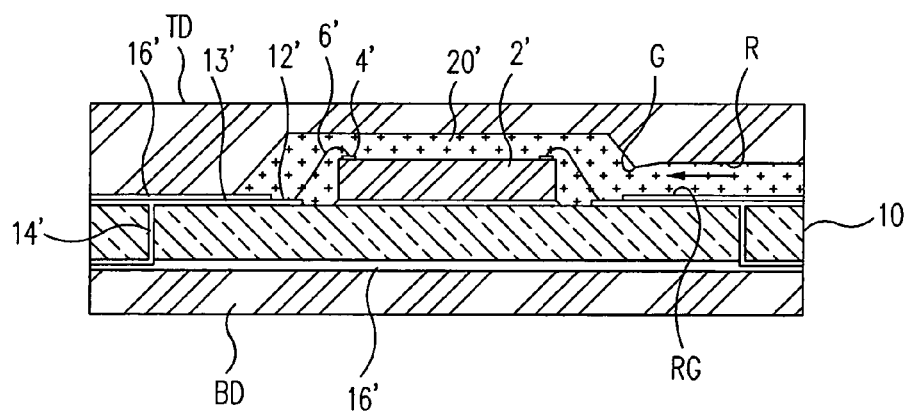
FIG. 18 is a cross-sectional view illustrating a molding step state in the fabrication of the conventional semiconductor package.

Thereafter, cover lay tape 120 is removed from circuit board strip 100 (FIG. 15G). In one embodiment, a punch 150 perforates through the slot 111 formed between neighboring substrips 110 to strip off one side of cover lay tape 120 from circuit board strip 100. By doing so, cover lay tape 20 can be easily peeled off circuit strip 100. Heat or ultraviolet light may be applied to cover lay 120 to enable easy removal. Subsequently, individual packages 1 are singulated by, for example, cutting through resin film 11 around through hole 18 of each circuit board 10 using a saw or laser or equivalent cutting means (FIG. 15H).

Referring to FIGS. 1–9, the semiconductor packages of the present invention have a semiconductor chip 2 located inside the through hole 18 of the circuit board 10. Accordingly, the thickness of the semiconductor chip 2 is offset by that of the circuit board 10, which makes the semiconductor package remarkably thin. Further, one face of the semiconductor chip 2 may be directly exposed out of the encapsulant, or the conductive thin film or heat spreading plate may be formed thereon, to increase heat radiation, improving thermal and electrical performance of the semiconductor chip.

Moreover, the conductive ink film is formed on the exposed face of the semiconductor chip 2, the co-planar surface of the encapsulant 20, and a predetermined region of the co-planar face 11b of the circuit board 10, which allows for simultaneous marking and grounding of the semiconductor chip 2. Further, as described above, the matrix type circuit board strip 100 and the methods described herein allows tens to hundreds of semiconductor packages to be simultaneously fabricated using a single circuit board strip.

In addition, the circuit board strip 100 of the present invention employs plural separate cover lay tapes 120 which are attached to one to one relation with the substrips 110, or one-body cover lay 120 which covers all the substrips 110 and has the cutting pin hole line 121 corresponding to the slot 111 formed between neighboring substrips 110 to minimize any warpage caused by the difference in the thermal expansion coefficients between difference materials, and thus prevents a variety of defects that otherwise would be generated during the fabrication of the semiconductor package in advance. Further, in one embodiment, a punch perforates 150 through the slot 111 to easily and safely remove the cover lay tape 120, preventing or minimizing damages in the circuit board strip.

Moreover, the ground ring 114 or ground plane 113 is formed on the circuit board strip 100 so as to previously prevent the accumulation of static electricity in the step of molding. This effectively solves various problems including damage to the semiconductor chips and/or circuit patterns of the circuit board strip due to momentary discharging of static electricity. Furthermore, the runner gate RG and opening H into which the encapsulant is poured are not formed in the circuit board but in the closing means C, such as cover lay tape 120, to increase the number of the conductive balls as the input/output terminals, resulting in great freedom in the designing of the circuit pattern.

In addition, it is possible to form a large runner gate and opening into which the encapsulant is poured on the bottom side of the closing means instead in the circuit board (FIG. 13). Accordingly, molding can be securely and easily performed even in the matrix type circuit board strip having tens to hundreds of units, and satisfactory resin charge profile can be obtained. Further, the shape of the mold can be simplified so as to reduce the product cost.

Alternatively, as in FIG. 14, when the runner gate and opening are not formed in the circuit board or closing means, the resin may be poured through a mold gate of a predetermined diameter located above the cavity of a top die so as to minimize the sweeping phenomenon of the bonding wire in the step of molding.

It will be apparent to those skilled in the art that various modifications and variations can be made in the semiconductor package and method of fabricating the same of the present invention without departing from the spirit or scope of the invention. Thus, it is intended that the present invention cover the modifications and variations of this invention provided they come within the scope of the appended claims and their equivalents.

What is claimed is:

1. A stackable semiconductor package comprising:
a substrate having a first surface, an opposite second surface, and central throughhole between the first and second surfaces;
a plurality of electrically conductive circuit patterns on each of the first and second surfaces of the substrate, wherein the circuit patterns of each of the first and second surfaces of the substrate include a plurality of lands, the circuit patterns of the first surface also include a plurality of bond fingers, and at least some of the circuit patterns of the first surface are electrically connected through the substrate to some of the circuit patterns of the second surface;
a semiconductor chip in said throughhole and electrically connected to the bond fingers, wherein the semiconductor chip has a first surface with bond pads thereon, and an opposite second surface, the first surface of the semiconductor chip faces in a same direction as the first surface of the substrate, and the second surface of the semiconductor chip is flush with the second surface of the substrate, wherein the second surface of the semiconductor chip is exposed; and
a hardened encapsulant within said through hole and covering the semiconductor chip and the bond fingers, wherein the lands of each of the first and second surfaces are outward of a perimeter of the encapsulant.

2. The stackable semiconductor package of claim 1, wherein the substrate further comprises a cover coat over the circuit patterns of the first and second surfaces of the substrate, wherein the respective lands and bond fingers are exposed through respective apertures in the cover coat.

3. The stackable semiconductor package of claim 1, further comprising a plurality of electrically conductive balls, wherein each of the conductive balls is fused to a respective one of the lands of the first surface of the substrate.

4. The stackable semiconductor package of claim 3, further comprising a plurality of second electrically conductive balls, wherein each of the second electrically conductive balls is fused to a respective one of the lands of the second surface of the substrate.

5. The stackable semiconductor package of claim 1, further comprising a plurality of electrically conductive balls, wherein some of said electrically conductive balls are fused to respective ones of the lands of the first surface of the substrate and some of said electrically conductive balls are fused to respective ones of the lands of the second surface of the substrate.

6. The stackable semiconductor package of claim 1, further comprising a plurality of electrically conductive balls, wherein each said electrically conductive ball is fused to a respective one of the lands of the second surface of the substrate.

7. A stack of semiconductor packages comprising:
a first semiconductor package comprising: (a) a substrate having a first surface, an opposite second surface, and central throughhole between the first and second surfaces; (b) a plurality of electrically conductive circuit patterns on each of the first and second surfaces of the substrate, wherein the circuit patterns of each of the first and second surfaces of the substrate include a plurality of lands, the circuit patterns of the first surface also include a plurality of bond fingers, and at least some of the circuit patterns of the first surface are electrically connected through the substrate to some of the circuit patterns of the second surface that include respective ones of the lands; (c) a semiconductor chip in said throughhole and electrically connected to the bond fingers, wherein the semiconductor chip has a first surface with bond pads thereon, and an opposite second surface, the first surface of the semiconductor chip faces in a same direction as the first surface of the substrate, and the second surface of the semiconductor chip is flush with the second surface of the substrate, wherein the second surface of the semiconductor chip is exposed; (d) a hardened encapsulant within said through hole and covering the semiconductor chip and the bond fingers, wherein the lands of each of the first and second surfaces are outward of a perimeter of the encapsulant; and (e) a plurality of electrically conductive balls, wherein each of the conductive balls is fused to a respective one of the lands of the first surface of the substrate; and a second semiconductor package comprising a plurality of second electrically conductive balls, wherein the second semiconductor package is in a stack with the first semiconductor package, and the second electrically conductive balls of the second package each superimpose and are electrically connected to a respective one of the lands of the second surface of the substrate of the first semiconductor package.

8. The stack of claim 7, wherein the second semiconductor package includes a second substrate with a central second throughhole, the second semiconductor chip is in the second throughhole, and the second semiconductor package further comprises a hardened second encapsulant in the second throughhole and covering the second semiconductor chip.

9. The stack of claim 8, wherein the substrate of the first package further comprises a cover coat over the circuit patterns of the first and second surfaces of the substrate, wherein the respective lands and bond fingers are exposed through respective apertures in the cover coat.

* * * * *

UNITED STATES PATENT AND TRADEMARK OFFICE
CERTIFICATE OF CORRECTION

PATENT NO. : 7,190,071 B2 Page 1 of 1
APPLICATION NO. : 10/785528
DATED : March 13, 2007
INVENTOR(S) : WonSun Shin et al.

It is certified that error appears in the above-identified patent and that said Letters Patent is hereby corrected as shown below:

On The Title Page, Item -75-, Line 3, change "Chacheongsao(KR)" to --Chacheongsao(TH) --.

Signed and Sealed this

Twelfth Day of June, 2007

JON W. DUDAS
*Director of the United States Patent and Trademark Office*